United States Patent
Weichsel

(10) Patent No.: US 11,217,426 B2
(45) Date of Patent: Jan. 4, 2022

(54) ION SOURCE AND METHOD

(71) Applicant: VON ARDENNE Asset GmbH & Co. KG, Dresden (DE)

(72) Inventor: Tim Weichsel, Dresden (DE)

(73) Assignee: VON ARDENNE Asset GmbH & Co. KG, Dresden (DE)

( * ) Notice: Subject to any disclaimer, the term of this patent is extended or adjusted under 35 U.S.C. 154(b) by 0 days.

(21) Appl. No.: 17/330,464

(22) Filed: May 26, 2021

(65) Prior Publication Data

US 2021/0375584 A1 Dec. 2, 2021

(30) Foreign Application Priority Data

May 27, 2020 (DE) ...................... 10 2020 114 162.9

(51) Int. Cl.
*H01J 37/30* (2006.01)
*H01J 37/08* (2006.01)
*H01J 27/14* (2006.01)

(52) U.S. Cl.
CPC ............. *H01J 37/30* (2013.01); *H01J 27/14* (2013.01); *H01J 37/08* (2013.01)

(58) Field of Classification Search
CPC ............. H01J 37/30; H01J 37/08; H01J 27/14
See application file for complete search history.

(56) References Cited

U.S. PATENT DOCUMENTS

| 6,037,717 A | 3/2000 | Maishev et al. |
| 6,812,648 B2 | 11/2004 | Luten et al. |
| 7,241,360 B2 | 7/2007 | Shabalin et al. |
| 9,136,086 B2 | 9/2015 | Madocks |
| 2016/0049277 A1 | 2/2016 | Hwang et al. |

FOREIGN PATENT DOCUMENTS

| JP | 2009170355 A | 7/2009 |
| JP | 2010225410 A | 10/2010 |
| WO | 2019182111 A1 | 9/2019 |

OTHER PUBLICATIONS

German Search Report based on application No. 10 2020 114 162.9 (6 pages) dated Oct. 31, 2020 (for Reference Purpose Only).
Combined Search and Examination Report issued for the corresponding Great Britain patent application No. GB2107450.5, dated Jul. 9, 2021, 1 page (for informational purposes only).

*Primary Examiner* — Nicole M Ippolito
*Assistant Examiner* — Hanway Chang
(74) *Attorney, Agent, or Firm* — Viering, Jentschura & Partner

(57) ABSTRACT

An ion source can have: a multiplicity of electrodes, which are mounted electrically separated from one another and have: a first electrode, which has a depression; a second electrode, which is arranged in the depression; a third electrode, which partially covers the depression and through which a slit passes which exposes the second electrode; one or more than one magnet, which is designed to provide a magnetic field in the slit.

15 Claims, 21 Drawing Sheets

FIG. 1
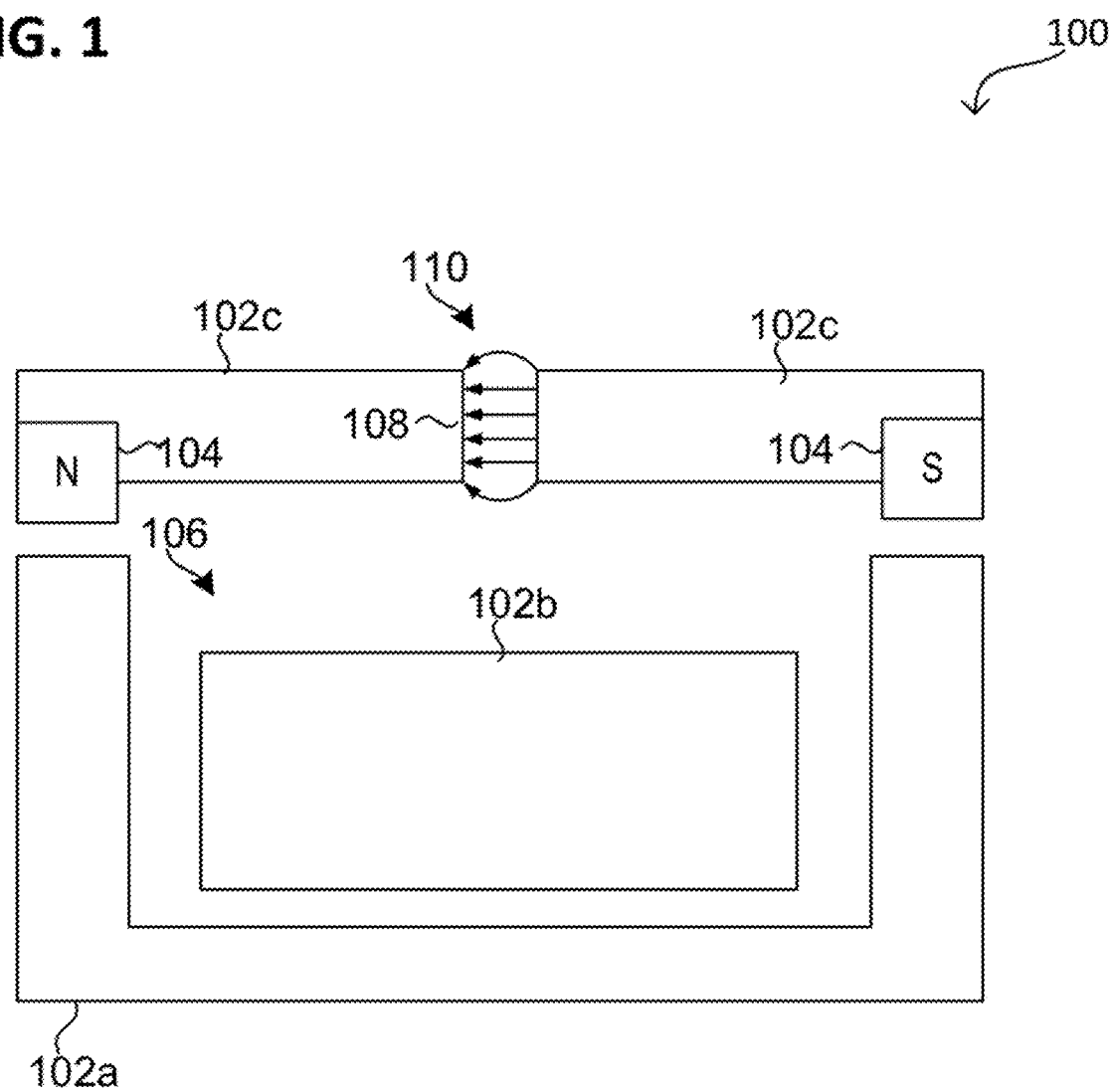
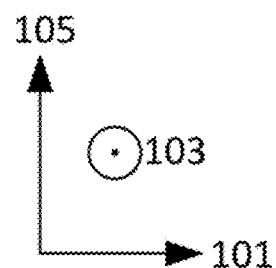

FIG. 2
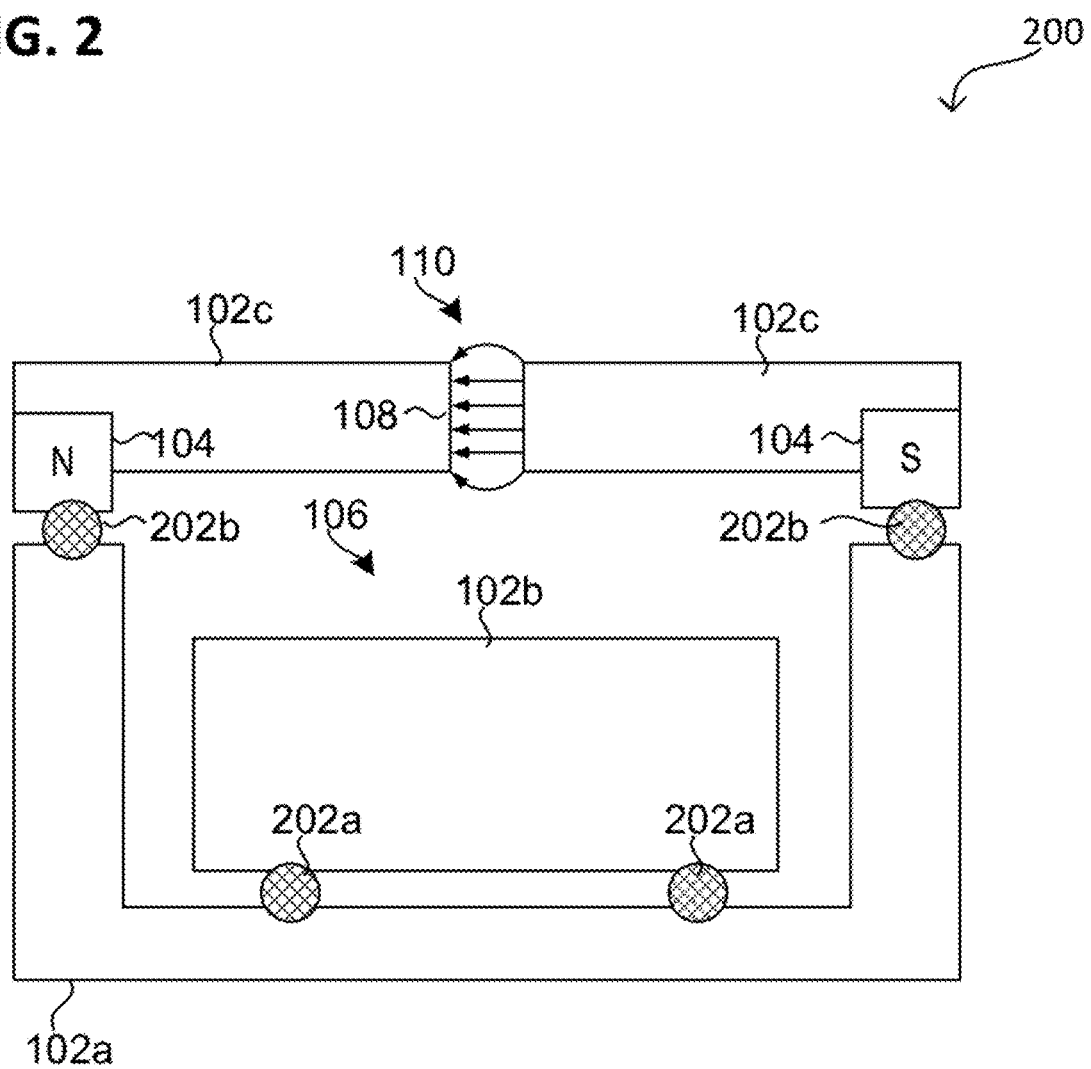
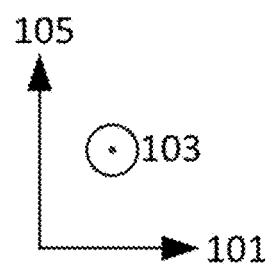

FIG. 4
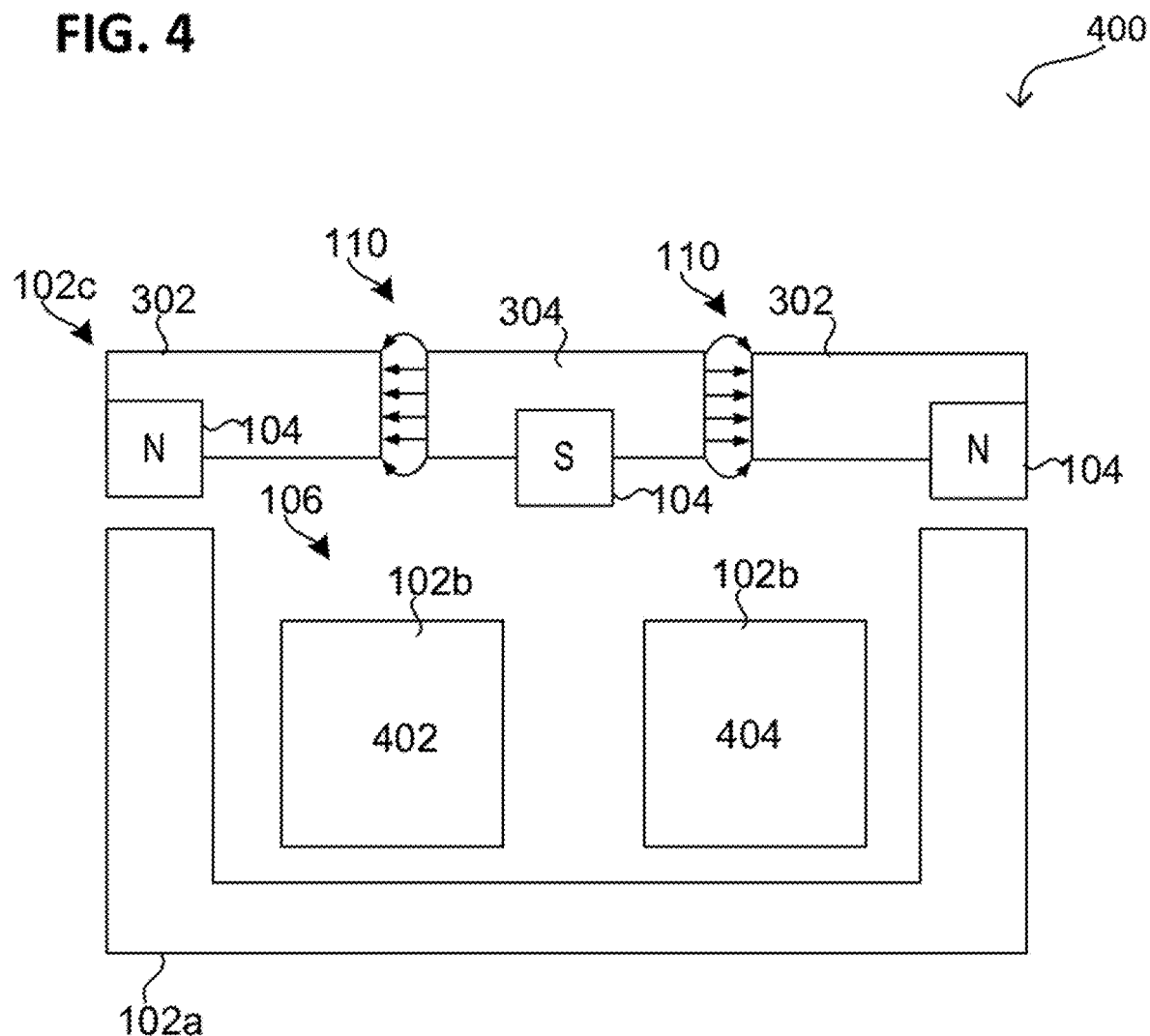
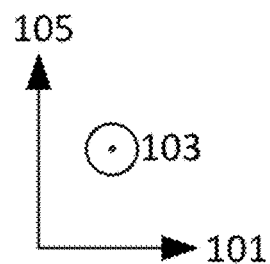

FIG. 8
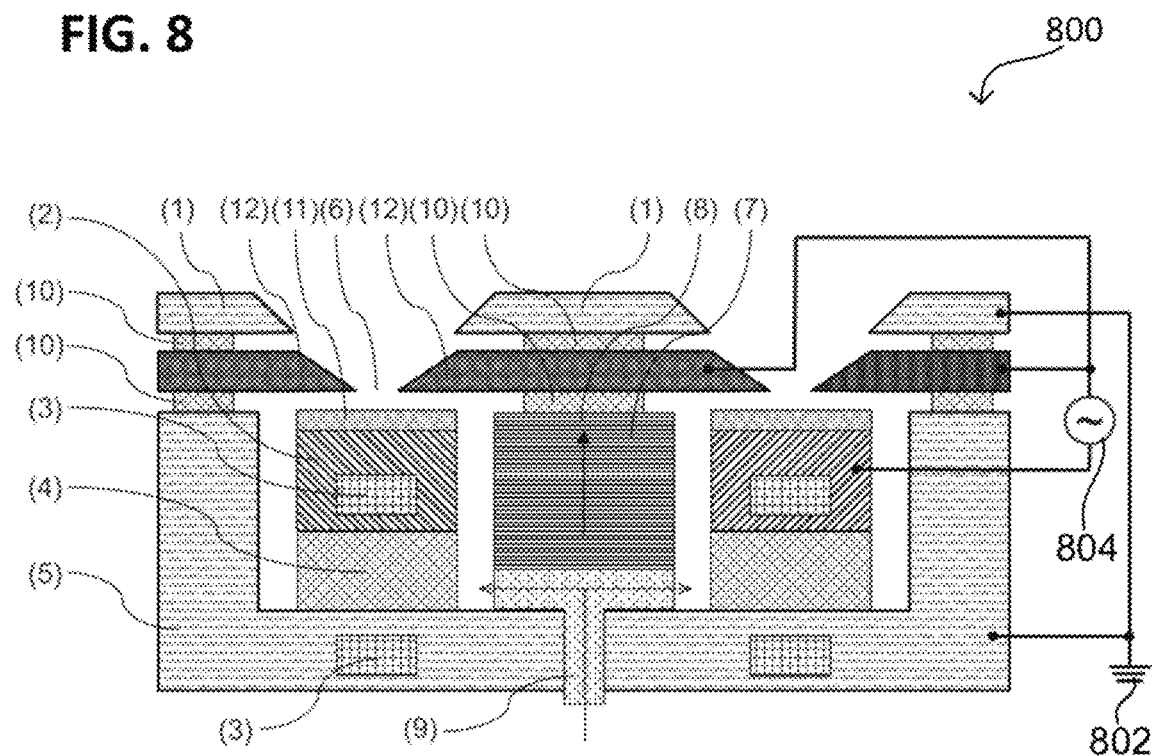
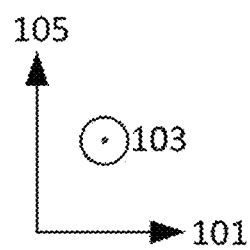

FIG. 9
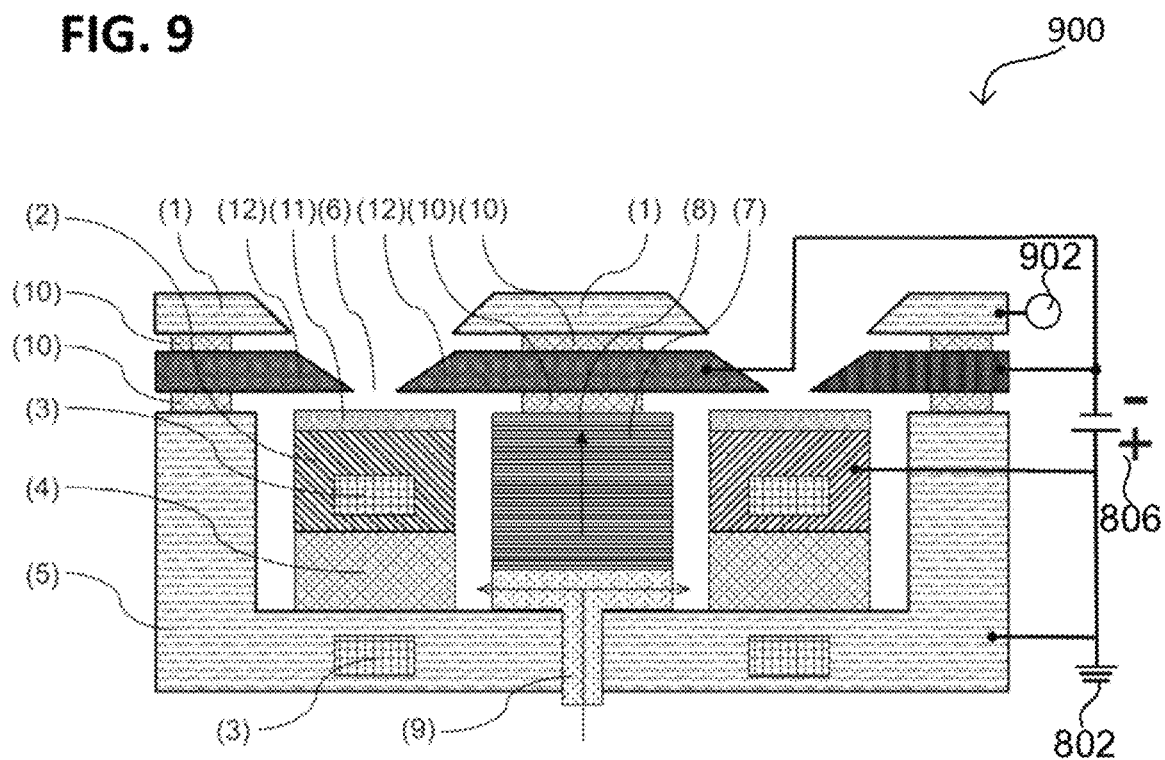
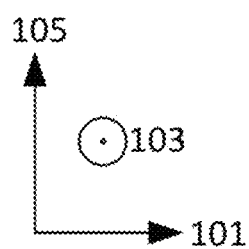

FIG. 10
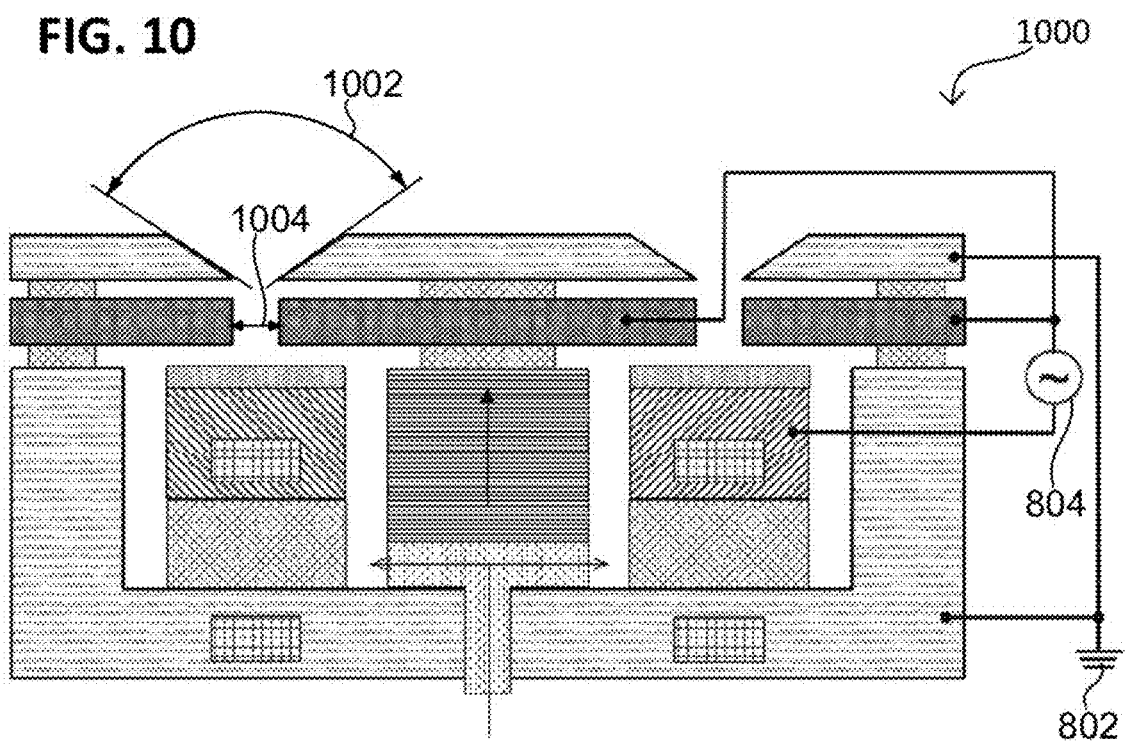
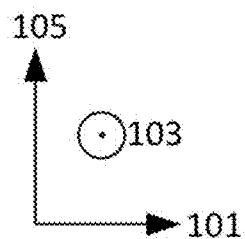

FIG. 11
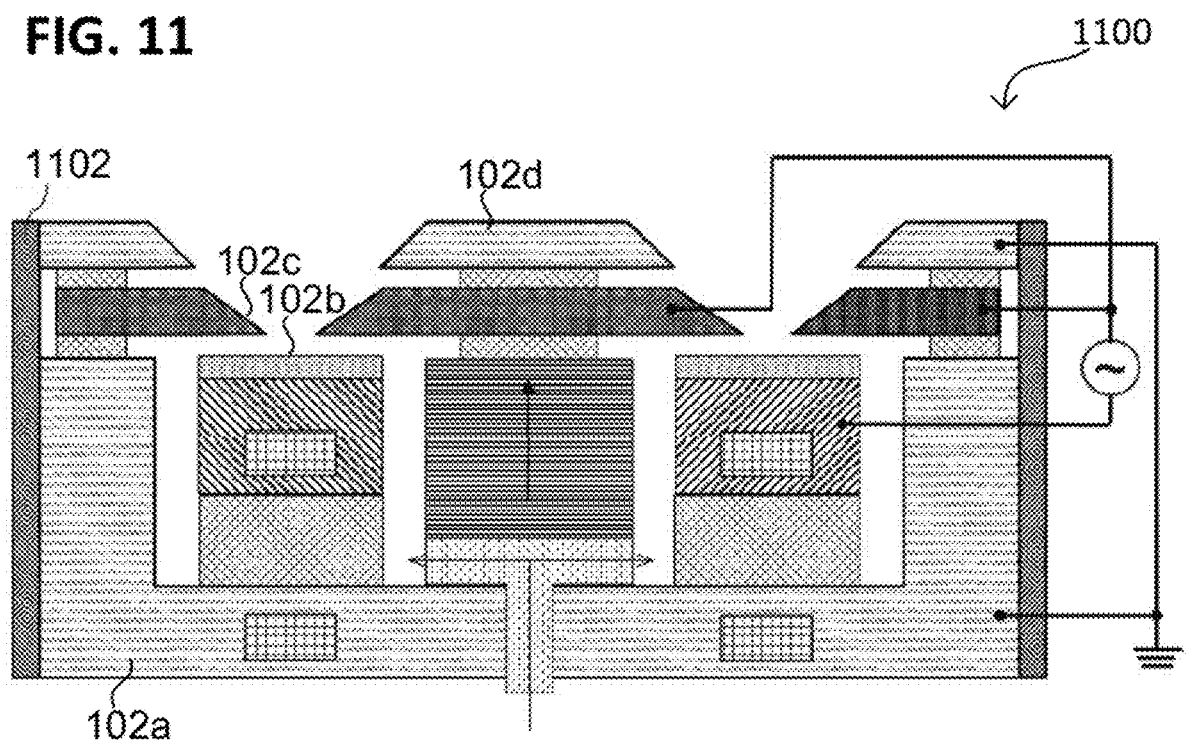
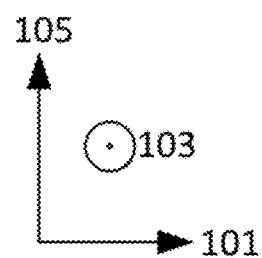

FIG. 19
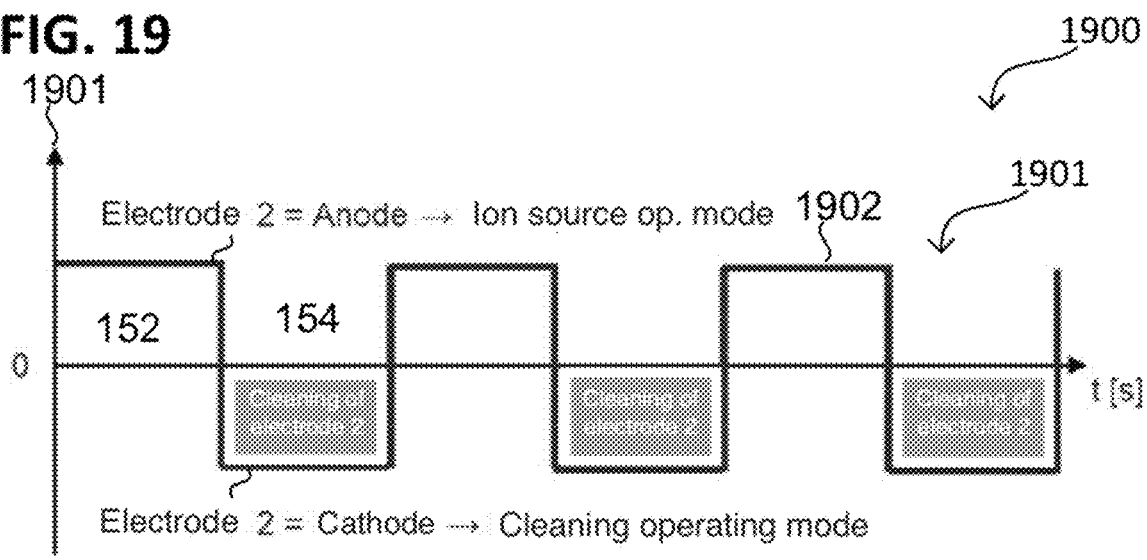
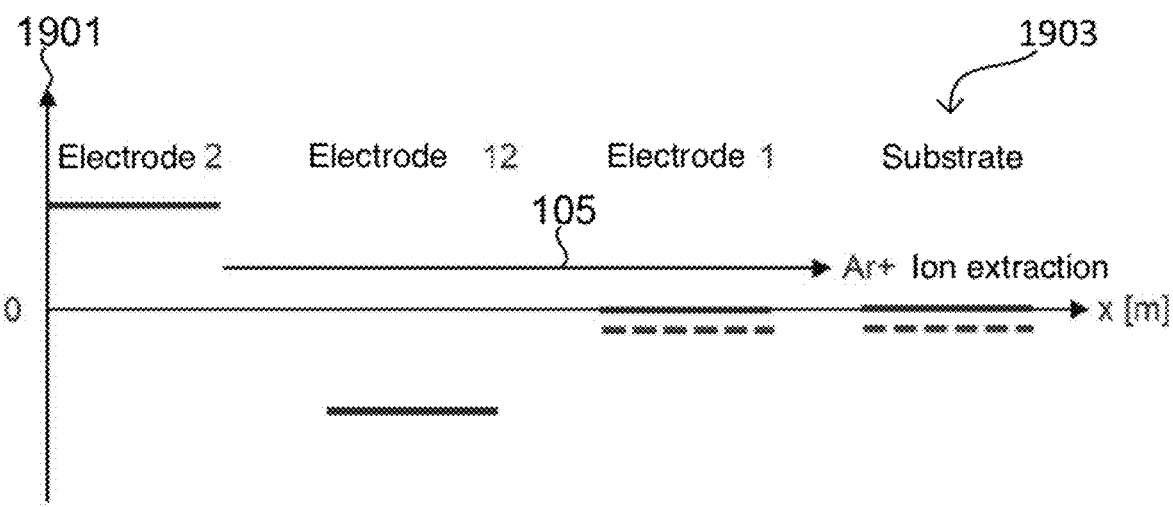
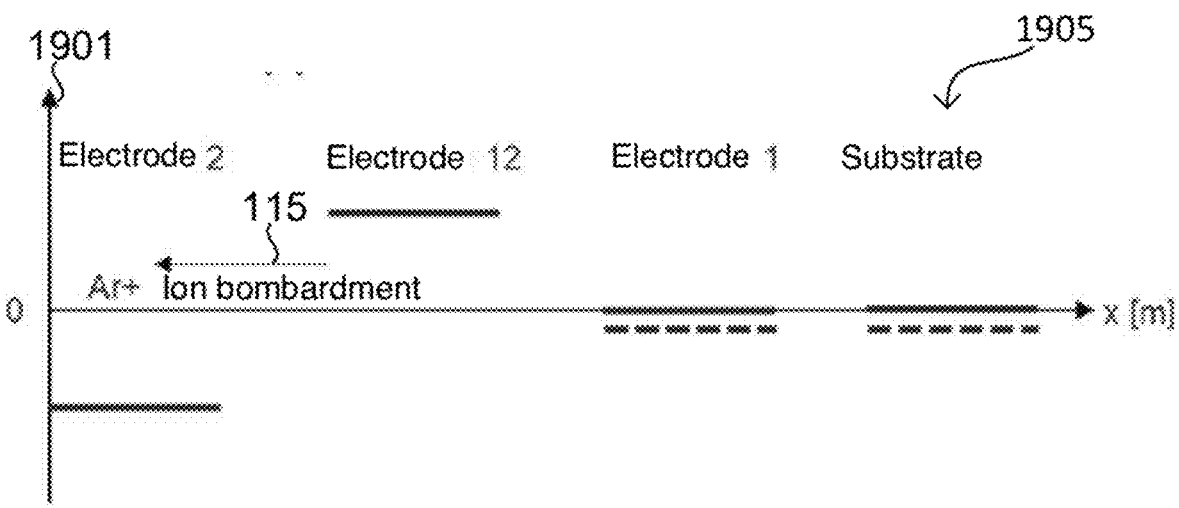

ION SOURCE AND METHOD

CROSS-REFERENCE TO RELATED APPLICATIONS

This application claims priority to German Patent Application 10 2020 114 162.9, which was filed on May 27, 2020, the entirety of which is incorporated herein by reference.

TECHNICAL FIELD

Various exemplary embodiments relate to an ion source, a method, a control apparatus and a drive arrangement.

BACKGROUND

In general, workpieces or substrates can be processed, for example treated, coated, heated, etched and/or structurally changed. A method for treating a substrate is, for example, ion irradiation. Using ion irradiation, for example, the substrate can be irradiated with ions, with the result that these ions are built into the substrate or remove material from the substrate. For this purpose, a plasma-forming gas can be ionized between two electrodes, wherein the ions for the irradiation are extracted from the plasma formed in the process. The extracted ions can be accelerated towards the substrate with which they ultimately interact.

The plasma formation can be assisted by using a magnetic field in order to increase or concentrate the ionization rate of the plasma-forming gas locally. In order to generate the magnetic field, a system of magnets can have been or can be arranged relative to the electrode in such a way that a plasma channel, a so-called racetrack, in which plasma can form, can be formed close to the electrode.

For the magnetic-field-assisted plasma generation for the ion irradiation, use is conventionally made of a so-called anode layer ion source or closed drift ion source (ALS).

During operation of the ion source, however, material can be deposited on the electrode operating as an anode (referred to as anode for short). Conventionally, in addition generators, changeover switches and/or a further ion source (in the bipolar operating mode) are used to counteract this parasitic coating. Likewise, oxygen is used to clean the anode. However, oxygen also inhibits the sputtering rate on the substrate.

In accordance with various embodiments, it has been identified that these concepts are based on acting externally on the ion source and therefore require additional complexity and additional costs.

BRIEF DESCRIPTION OF THE FIGURES

In the drawings

FIGS. 1 to 11 each show an ion source in accordance with various embodiments in various schematic views;

FIGS. 19 to 21 each show various operating modes of the ion source in accordance with various embodiments in various schematic graphs.

DETAILED DESCRIPTION

Figure 3:
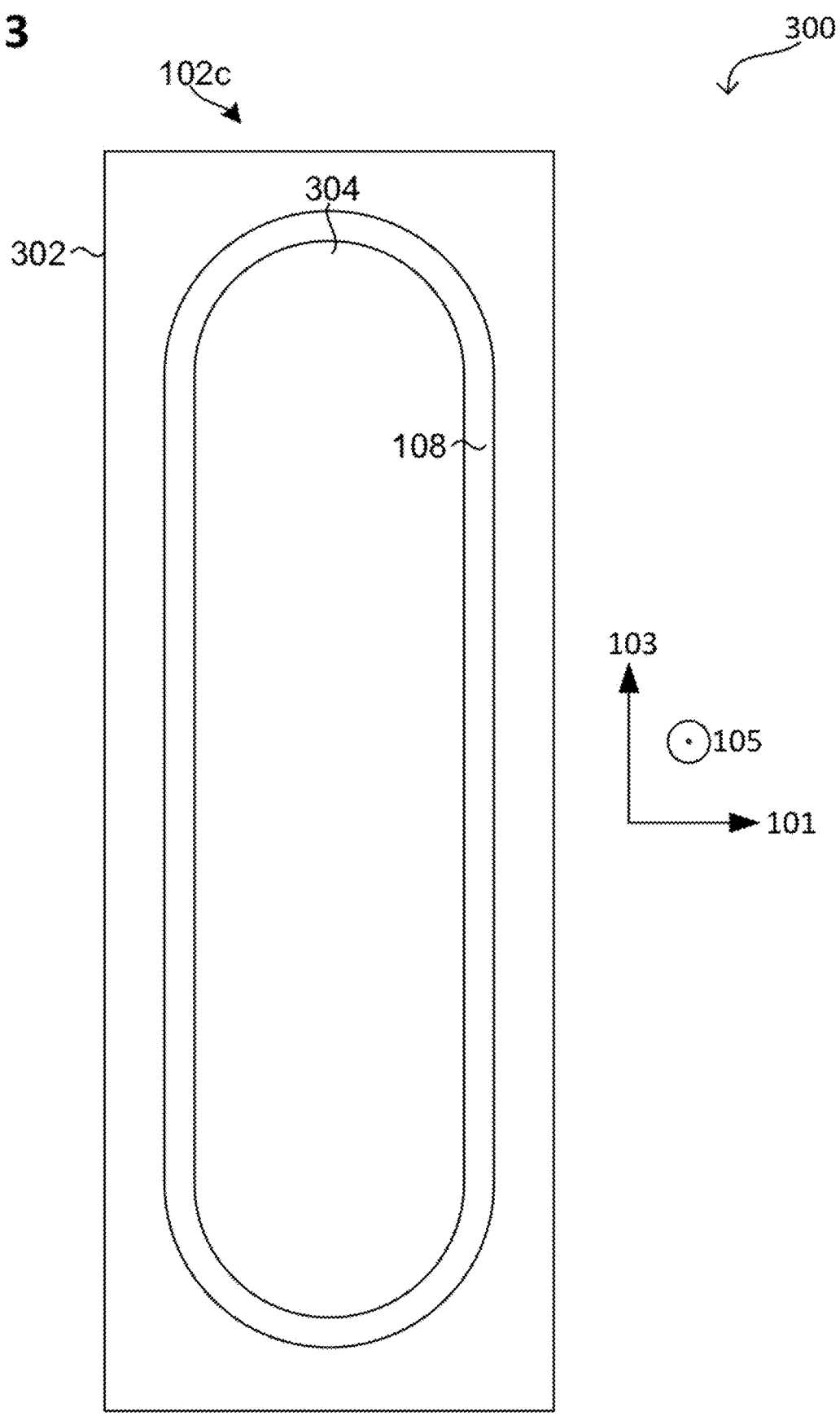

In the detailed description below, reference is made to the attached drawings, which form part of this description and in which, for illustrative purposes, specific embodiments are shown in which the invention can be executed. In this respect, directional terminology such as, for example, "top", "bottom", "front", "rear", etc. is used with reference to the orientation of the described figure(s). Since components of embodiments can be positioned in a number of various orientations, the directional terminology is used for illustrative purposes and is in no way restrictive. It goes without saying that other embodiments can be used and structural or logical changes can be made without departing from the scope of protection of the present invention. It goes without saying that the features of the various exemplary embodiments described herein can be combined with one another, if not specifically specified otherwise. The detailed description below should therefore not be interpreted in a restrictive sense, and the scope of protection of the present invention is defined by the attached claims.

In the context of this description, the terms "connected" and "coupled" are used for describing both a direct and an indirect connection (for example resistive and/or electrically conductive;

for example an electrically conductive connection), and a direct or indirect coupling. In the figures, identical or similar elements are provided with identical reference symbols insofar as this is expedient.

In accordance with various embodiments, the term "coupled" or "coupling" can be understood within the meaning of a (for example mechanical, hydrostatic, thermal and/or electrical), for example direct or indirect, connection and/or interaction. A plurality of elements can be coupled to one another, for example, along a chain of interaction along which the interaction (for example a signal) can be transmitted. For example, two elements coupled to one another can exchange an interaction with one another, for example a mechanical, hydrostatic, thermal and/or electrical interaction. In accordance with various embodiments, "interlocked" can be understood within the meaning of a mechanical (for example physical) coupling, for example by means of a direct physical contact. An interlocking can be designed to transmit a mechanical interaction (for example force, torque, etc.).

In this connection, it has been identified that the ion source can be designed in such a way that it itself inhibits the parasitic coating, for example by virtue of it cleaning itself and/or counteracting the cause of the parasitic coating.

Therefore, in accordance with various embodiments, an ion source, a method, a control apparatus and a drive arrangement are provided which inhibit this parasitic coating. Ostenisvely, a configuration of a plurality of electrodes of the ion source is provided in such a way that a more complex electrical field distribution can be generated by means of these electrodes which inhibits the parasitic coating. The electrical field distribution can be generated (also referred to as cleaning operating mode), for example, in such a way that the parasitic coating is removed again in phases, with the result that the quantity of material deposited averaged over time is reduced. The electrical field distribution can be generated (also referred to as low-ion energy operating mode), for example, in such a way that the kinetic energy of the ions is minimized at the time at which the substrate is reached, with the result that the quantity of material originating from the substrate per unit time is lower. The ion source thus provided can have a longer service life and/or a reduced parasitic coating and/or can enable the irradiation of substrates with low ion energies in such a way that the substrate is not sputtered/does not have material removed and instead only surface activation of the substrate takes place.

Ostenisvely, the ion source has two electrodes and one or more than one additional electrode (also referred to as supplementary electrode), for example mounted so as to be electrically isolated. The supplementary electrode makes it possible for the ion source to be capable of being operated not only by means of a DC voltage (also referred to as a DC voltage operating mode), but also by means of an AC voltage (also referred to as AC voltage operating mode). The AC voltage operating mode achieves a situation whereby, per voltage period duration, at one time ions are emitted in the direction towards the substrate and then at one time ions are taken up for removing the parasitic coating (for example in the direction away from the substrate and/or into the interior of the ion source) (also referred to as cleaning phase or cathode phase).

As an alternative to the AC voltage operating mode, the one or more than one supplementary electrode makes it possible to provide, in the DC voltage operating mode, a more complex electrical field distribution which decelerates the ions before they reach the substrate. For example, the potential of the electrode operated as anode can be closer to the potential (for example earth potential) of the substrate while a supplementary electrode positioned thereabove is at a negative electrical potential (for example in the –kV range). Thereby, the potential difference between the anode and the substrate (which is earthed, for example, or has a floating electrical potential) is reduced. The kinetic energy of the ions extracted from the emission slit owing to the acceleration as a result of the electrical potential difference between the plasma and the substrate is therefore reduced and can be, for example, in the two-digit eV range.

Herein, reference is made to temporally invariant (also referred to as invariable) and temporally variable physical variables (for example a voltage). The variability or invariability can be understood as being based on a time period of at least a plurality of periods of an AC voltage with which the ion source is supplied and/or of at least one second or at least one period of a nation-wide mains voltage. The ion source can be supplied, for example, with a supply voltage in the kHz range, with the result that the time period can have a plurality of period durations of at least 1 ms (millisecond).

Control can be understood to mean intended influencing of a system. In this case, the instantaneous state of the system (also referred to as actual state) can be changed in accordance with a preset (also referred to as setpoint state). Closed-loop control can be understood to mean control whereby, in addition, a change in state of the system is counteracted by interference. Ostenisvely, the control can have a forwardly directed control path and therefore ostenisvely can implement sequential control, which converts an input variable (for example the preset) into an output variable. The control path can also be part of a control loop, however, with the result that closed-loop control is implemented. In contrast to the purely forwardly directed sequential control, the closed-loop control has a continuous influencing of the output variable on the input variable, which is brought about by the control loop (feedback). In other words, as an alternative to or in addition to the control, closed-loop control can be used or, as an alternative to or in addition to the control, closed-loop control can take place. The state of the system (also referred to as working point) can be represented by one or more than one controlled variable of the system, whose actual value represents the actual state of the system and whose setpoint value (also referred to as reference value) represents the setpoint state of the system. In the case of closed-loop control, an actual state of the system (for example determined on the basis of a measurement) is compared with the setpoint state of the system, and the one or more than one controlled variable is influenced by means of a corresponding manipulated variable (using an actuator) in such a way that the discrepancy between the actual state and the setpoint state of the system is minimized.

Electrically conductive can herein be understood to mean having an electrical conductivity of more than approximately 1 siemens per metre (S/m), for example more than approximately $10^3$ S/m or more than approximately $10^5$ S/m. Electrically insulating can herein be understood to mean having an electrical conductivity of less than approximately $10^{-6}$ siemens per metre (S/m), for example less than approximately $10^{-8}$ S/m, than approximately $10^{-10}$ S/m or than approximately $10^{-12}$ S/m.

A magnet can have a magnetized material with a magnetization and can ostenisvely be designed as a permanent magnet. The magnet can have, for example, a hard-magnetic material or be formed therefrom. Ostenisvely, a hard-magnetic material can have a high coercive field strength, for example approximately $10^3$ A/m (amperes per metre) or more, for example approximately $10^4$ A/m or more, for example approximately $10^5$ A/m or more. Examples of a hard-magnetic material have: a rare-earth compound (such as neodymium iron boron (NdFeB) or samarium cobalt (SmCo)), hard-magnetic ferrite, Bismanol and/or aluminium nickel cobalt.

Soft-magnetic material can be understood to mean a magnetizable (for example ferromagnetic) material which can ostenisvely be remagnetized easily, i.e. ostenisvely has a low coercive field strength, for example less than approximately $10^3$ A/m, for example less than approximately 100 A/m, for example less than approximately 10 A/m. Examples of a soft-magnetic material have: iron, soft-magnetic ferrite, steel, cobalt, amorphous metal, an NiFe compound.

The magnetic (for example soft-magnetic and/or hard-magnetic) material can have, for example, a magnetic permeability of approximately 10 or more, for example approximately 100 or more, for example approximately $10^3$ or more, for example approximately $10^4$ or more, for example approximately $10^5$ or more.

Nonmagnetic material can be understood to mean a material which is substantially magnetically neutral, for example slightly paramagnetic or slightly diamagnetic. The nonmagnetic material can have, for example, a magnetic permeability of substantially 1, i.e. in a range of from approximately 0.9 to approximately 1.1. Examples of a nonmagnetic material have: graphite, aluminium, platinum, copper, a ceramic (for example an oxide).

Herein, the formation of a plasma can be understood to mean that atoms of a gas (also referred to as plasma-forming gas) are ionized. The gas can have, for example, an inert gas, such as argon, for example. The ionization can comprise that electrons are taken from the gas atoms so that positively charged atomic residues (the so-called ions) are formed. The plasma has ions and electrons. If the plasma is subjected to an electrical field, the ions can be separated from the electrons (also referred to as extraction of ions), with the result that an electrical charge transfer takes place, i.e. an electrical current flows. By means of the ion source, the plasma can be generated and the ions extracted therefrom can be focused to form an ion beam (i.e. a directed flow of ions) and accelerated (also referred to as ion emission).

In accordance with various embodiments, a cause of the parasitic coating of the ion source has been identified as being the ions extracted from the plasma partially also colliding with the electrode operated as cathode (also referred to as cathode for short), as a result of which said electrode has material removed (for example is sputtered) and the material coming free in the process is transferred to the anode. A cause has further been identified as being that material removed from the substrate (for example sputtered) can be transferred to the anode. In this case, it has been identified that the quantity of material transferred from the substrate to the anode increases the greater the kinetic energy per ion is.

As the quantity of material on the anode increases, the risk increases that the layer formed in the process is detached from the anode and comes into contact with the cathode. If a short circuit arises as a result, the ion irradiation is interrupted and it may be necessary for the installation to be ventilated so that the ion source can be cleaned. In the case of certain substrates, the material deposited on the anode can also be electrically insulating, which increasingly inhibits the electrical effectiveness of the anode (i.e. passivates said anode) until a process interruption may likewise be necessary in order to clean the ion source.

In accordance with various embodiments, an ion source can be used for irradiating a substrate with ions (also referred to as ion irradiation). The ion irradiation can, owing to the interaction with the irradiated surface of the substrate (also referred to as product to be treated), effect that the substrate is sputtered and/or that foreign material is removed from the substrate (for example water, an adsorbate or an oxide). The irradiation of the substrate can take place, for example, for pre-treatment of the substrate, for surface cleaning and/or for increasing the adhesion. Following the ion irradiation, the substrate can optionally be coated, for example without breaking the vacuum (for example in the same vacuum coating installation).

In accordance with various embodiments, the ion source provided herein can be of the type closed drift ion source (ALS) (i.e. can provide a closed racetrack). An ALS can generate ions with a kinetic energy of a few hundred to several thousand electron volts per ion (i.e. 0.1 keV to 10 keV). Owing to the ion energies in the keV range, ALS are also used as ion sources for physical etching processes. In this case, the thickness of the layer located on the substrate can be reduced over a large area by sputtering by means of the ions generated by the ion source.

Furthermore, ALS are also used for layer deposition in the vacuum. In the case of so-called ion beam sputtering (IBS), the ions provided by means of the ALS sputter a so-called target material. The sputtered target material then settles on the substrate to be coated. This coating of the type of physical gas phase deposition by means of ALS is used, for example, when there are stringent requirements in respect of the residual gas purity.

In addition, ALS are used by means of the use of layer-forming precursors, such as butane, for example, for the deposition of a diamond-like carbon layer, a so-called DLC layer.

In addition, ALS are used in processes of ion beam-assisted deposition (IBAD) in addition to a coating source in order to change, for example, the density, crystal structure, doping and/or texture of the layer deposited by means of the coating source by means of additional ion bombardment.

The ion source in accordance with various embodiments makes it possible to extend the use possibilities, for example to a low-energy substrate irradiation, for example for substrate pre-treatment. For example, by means of the ion source in the low-ion energy operating mode, the kinetic energy on impingement on the substrate per ion (also referred to as ion energies) can be reduced to less than 100 eV (electron volts), for example the acceleration voltage is nevertheless greater (for example in the keV range). For example, the ion source can thus be used as an alternative to a plasma partial discharge process even for gentle surface activation of substrates in the vacuum. As a result of the lower ion energy, it is possible, for example, to prevent the substrate surface from being contaminated or damaged by working gas material, anode material and/or cathode material by implantation. For many applications, for example in the case of energy-sensitive substrate films or in electronics, this implantation is often unacceptable.

If the ion source is not operated in the low-ion energy operating mode, the extracted ions on impingement on the substrate can have an energy of more than one 1 keV (also referred to as keV range).

The one or more than one additional electrode (for example having an electrode referred to below as third electrode and/or an electrode referred to below as fourth electrode) enables one or more than one of the following:
- cleaning of the main electrode in an AC voltage operating mode, as a result of which the service life of the ion source can be considerably increased;
- an AC voltage operating mode in which, in addition, a plasma can be generated between two supplementary electrodes in the ion source operating mode, from which plasma, owing to the electrical field gradient between these supplementary electrodes, in addition electrons are extracted from the ion source which can be used for neutralizing surface charges, whereby an additional external electron source is no longer required in order to effect this neutralization;
- an AC voltage operating mode in which, in the cleaning operating mode, in addition ions can be extracted from the ion source since a plasma can be generated between two supplementary electrodes, from which plasma, owing to the electrical field gradient between the supplementary electrodes, ions can be accelerated out of the source onto the substrate, which counteracts a reduction in the total ion emission owing to the cleaning operating mode;
- a low-ion energy operating mode implemented by means of DC voltage operating mode, as a result of which the use range of the ion source can be extended to the substrate pre-treatment in a vacuum with low-energy ions without substrate damage and contamination;
- in comparison to other conventional concepts which inhibit a parasitic coating, a lower number of generators and/or changeover switches and/or ion sources.

Examples of a substrate have, in accordance with various embodiments: a film, a plate (for example consisting of metal, plastic, glass, silicon), a strip, a net, particles or the like.

Electrically floating can be understood to mean DC-isolated from the reference voltage (for example electrical earth) and the voltage supply. The electrical potential of a component part operated in electrically floating fashion therefore does not necessarily need to correspond, during operation, to the reference voltage or the voltage provided by the voltage supply, but can assume a value in between these values and/or can be dependent on the operating mode.

A component part operated in electrically floating fashion can be coupled, for example, substantially only capacitively to the surrounding component parts. The electrical potential of the component part operated in electrically floating fashion can then result, for example, as a result of a capacitively coupled-in voltage.

FIG. 1 illustrates an ion source 100 in accordance with various embodiments in a schematic side view or cross-sectional view (with a view transverse to the direction 105). The ion source 100 can have a plurality of electrodes 102a, 102b, 102c and forms one or more than one magnet 104 of the one magnetic field source 104.

The plurality of electrodes 102a, 102b, 102c can be or can have been mounted (for example held) in pairs so as to be electrically isolated (for example DC-isolated) from one another. Electrically separated can be understood to mean that an electrical resistance between two electrodes is greater than approximately $10^3 \Omega$ (ohms), for example greater than approximately $10^4 \Omega$, for example greater than approximately $10^5 \Omega$, for example greater than approximately $10^6 \Omega$. Electrically separated can be understood to mean that an electrical conductivity between two electrodes is less than $10^{-3}$ (for example than $10^{-6}$ or $10^{-9}$) of the electrical conductivity of each of the two electrodes.

For example, the electrodes can be separated from one another physically in pairs, for example by means of a slit between them and/or by means of an electrically insulating (for example dielectric) material between them. For this purpose, the ion source 100 can have, for example, one or more than one holding apparatus (not illustrated), which provides the slit and/or has the electrically insulating material.

Herein, a dielectric material can be understood to mean a material (for example a solid) in which the existing charge carriers are localized (i.e. not freely movable). The dielectric material can be electrically insulating.

The plurality of electrodes 102a, 102b, 102c have: a first electrode 102a, a second electrode 102b (also referred to as main electrode), and a third electrode 102c (ostenisvely a supplementary electrode). The first electrode 102a, second electrode 102b and/or third electrode 102c can be electrically conductive, for example. The first electrode 102a and/or third electrode 102c can have, for example, a greater magnetic permeability than the second electrode 102b. The first electrode 102a and/or third electrode 102c can be magnetizable, for example, (for example ferromagnetic, for example soft-magnetic) or can at least have a magnetizable (for example ferromagnetic, for example soft-magnetic) material, such as an iron-containing material, for example. The second electrode 102b can be nonmagnetic, for example, or can at least have a nonmagnetic material.

As an exemplary application case, the second electrode 102b operated as anode can be nonmagnetic, and the first electrode 102a and/or third electrode 102c operated as electrode can be magnetic in order to focus the magnetic flux density starting from the magnet into the slit.

The first electrode 102a has a depression 106. The first electrode 102a can be trough-shaped, for example, or can have at least one housing. The depression 106 can extend, for example, into the body of the first electrode 102a, for example from direction 105 (also referred to as emission direction 105).

The trough-shaped first electrode 102a can have, for example, a base wall, which delimits the depression 106 opposite to direction 105. The trough-shaped first electrode 102a can also have, for example, a peripheral side wall, which delimits the depression 106 in the plane 103, 101 (which is transverse to the direction 105).

The second electrode 102b can be arranged in the depression.

The third electrode 102c can at least partially cover the depression 106 and can have a slit 108 passing through it which (at least partially) exposes the second electrode 102b. The third electrode 102c can be designed, for example, in the form of a lid with respect to the trough shape of the first electrode 102a.

The slit 108 can, for example, pass through the third electrode 102c along the direction 105 and/or along a direction which points away from the second electrode 102b.

The magnetic field source 104 can be designed and arranged in such a way that it provides a magnetic field 110 in the slit. The magnetic field source 104, for example the magnet(s) thereof, can be provided, for example, (physically and/or electrically) separately from the third electrode 102c or can be at least partially (i.e. partially or completely) integrated therein. The magnetic field source 104 can be designed to generate the magnetic field 110 and to inject it onto mutually opposite sides of the slit 108.

The magnetic field source 104 can have, for example, two opposite magnet poles, which, in simplified form, are also referred to as north pole (N) and south pole (S). The slit 108 can be arranged between the north pole (N) and the south pole (S).

In one example, the field strength of the magnetic field 110 in the slit 108 can be in a range of from approximately 1 kA/m to approximately 1000 kA/m (kiloamperes per metre), for example in a range of from approximately 10 kA/m to approximately 100 kA/m. However, it is also possible for a field strength with a higher or lower value to be provided, for example by means of modification of the electrode geometry and/or the magnetization strength of the magnet.

In one example, an extent of the slit may be less than 6 mm, for example in a range of from approximately 2 mm to approximately 6 mm, for example in a range of from approximately 4 mm to approximately 6 mm or in a range of from approximately 2 mm to approximately 4 mm.

In the following text, further embodiments of the ion source 100 are explained.

FIG. 2 illustrates an ion source 100 in accordance with various embodiments 200 in a schematic side view or cross-sectional view (with a view transverse to the direction 105), in which the ion source 100 additionally has a plurality of dielectric holding structures, of which a first holding structure 202a holds the second electrode 102b and electrically separates (for example DC-isolates) it from the first electrode 102a, and a second holding structure 202b holds the third electrode 102c and electrically separates (for example DC-isolates) it from the first electrode 102a. Each of the holding structures 202a, 202b can have, for example, a dielectric material (also referred to as dielectric) or be formed therefrom. The second electrode 102b and/or the third electrode 102c can be supported, for example, by means of the respective holding structure 202a, 202b on the first electrode 102a, but this is not necessary.

FIG. 3 illustrates an ion source 100 in accordance with various embodiments 300 in a schematic side view or cross-sectional view (from direction 105), which can optionally be designed in accordance with the embodiments 200. In accordance with the embodiments 300, the third electrode 102c has a plurality of (for example plate-shaped) segments 302, 304, which are physically separated from one another by means of the slit 108. In other words, the slit 108 is formed between the segments 302, 304.

For example, the slit 108 can be extended along a closed path (also referred to as slit path). The path can run, for example, in a plane 103*a*, 101 which is preferably substantially transverse to the direction 105.

The slit path can generally have one or more than one curved section and/or one or more than one straight section. For example, the slit path, as illustrated, can have two straight and parallel running sections which are connected to one another at the end (also referred to as reversal region) in each case by means of a curved section. The slit path can nevertheless also be polygonal. Each curved section minimizes electron losses and electrical field strength peaks in comparison with an angular section. In general, the slit path can nevertheless also have rounded corners, which likewise minimizes electron losses and electrical field strength peaks. For example, the slit path can also be oval, for example circular, (in this case the ion source is also referred to as round source).

The segments 302, 304 can have, for example, a first (for example frame-shaped) segment 302, which has a through-opening, and a second segment 304, which is arranged in the through-opening. As an alternative or in addition, the segments 302, 304 can have, for example, a (contiguous) first segment 302 and a second segment 304, wherein the first segment 302 surrounds the second segment 304.

One or more than one segment of the plurality of (for example plate-shaped) segments 302, 304 can have, for example, a ferromagnetic (for example soft-magnetic) material or be formed therefrom, for example a metal. As an alternative or in addition, one or more than one segment of the plurality of (for example plate-shaped) segments 302, 304 can have an electrically conductive material or be formed therefrom, for example a metal.

The plurality of segments 302, 304 can be coupled magnetically to one another, for example by means of the magnetic field source 104. For example, the magnetic field source 104 can generate a magnetic field which is conducted through each of the plurality of segments 302, 304 and passes through the slit 108 between the plurality of segments 302, 304.

FIG. 4 illustrates an ion source 100 in accordance with various embodiments 400 in a schematic side view or a cross-sectional view (with a view transverse to the direction 105), which can optionally be designed in accordance with the embodiments 200 or 300.

In accordance with the embodiments 400, the third electrode 102*c* has a first segment 302, which has two sections, and a second segment 304, which has been arranged between the two sections. The two sections of the third electrode 102*c* can be contiguous, for example.

As an alternative or in addition, the second electrode 102*b* in accordance with the embodiments 400 has a plurality of sections 402, 404, between which a slit has been formed. The two sections 402, 404 of the second electrode 102*b* can be contiguous, for example. Each of the two sections 402, 404 of the second electrode 102*b* can be exposed (for example partially or completely) for example by the slit 108 of the third electrode 102*c*.

Figure 5:
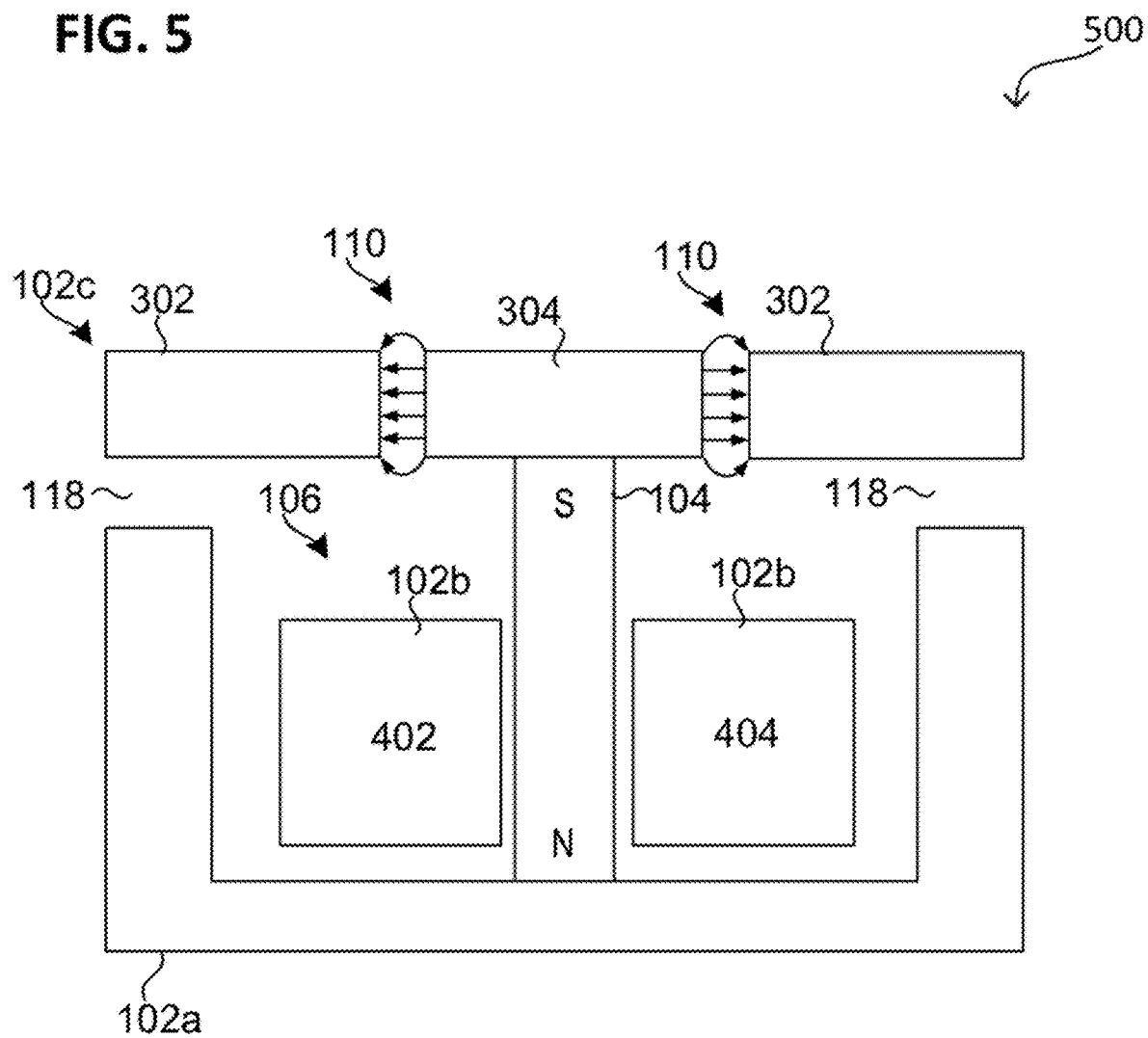

FIG. 5 illustrates an ion source 100 in accordance with various embodiments 500 in a schematic side view or cross-sectional view (with a view transverse to the direction 105), which can optionally be designed in accordance with one of the embodiments 200 to 400. In accordance with the embodiments 500, one or more than one magnet of the magnetic field source 104 has been arranged in the depression 106, for example between two sections of the second electrode 102*b*.

The magnetic field source 104 can be designed (for example arranged and/or aligned), for example, in such a way that the magnetic field 110 generated by it is coupled into the third electrode 102*c* (for example the second segment 304 thereof) and/or the first electrode 102*a*.

For example, the magnetic field source 104 can generate a magnetic field which is conducted through the first electrode 102*a* and the third electrode 102*c* and passes through a slit 118 between the two electrodes 102*a*, 102*c*.

Figure 6:
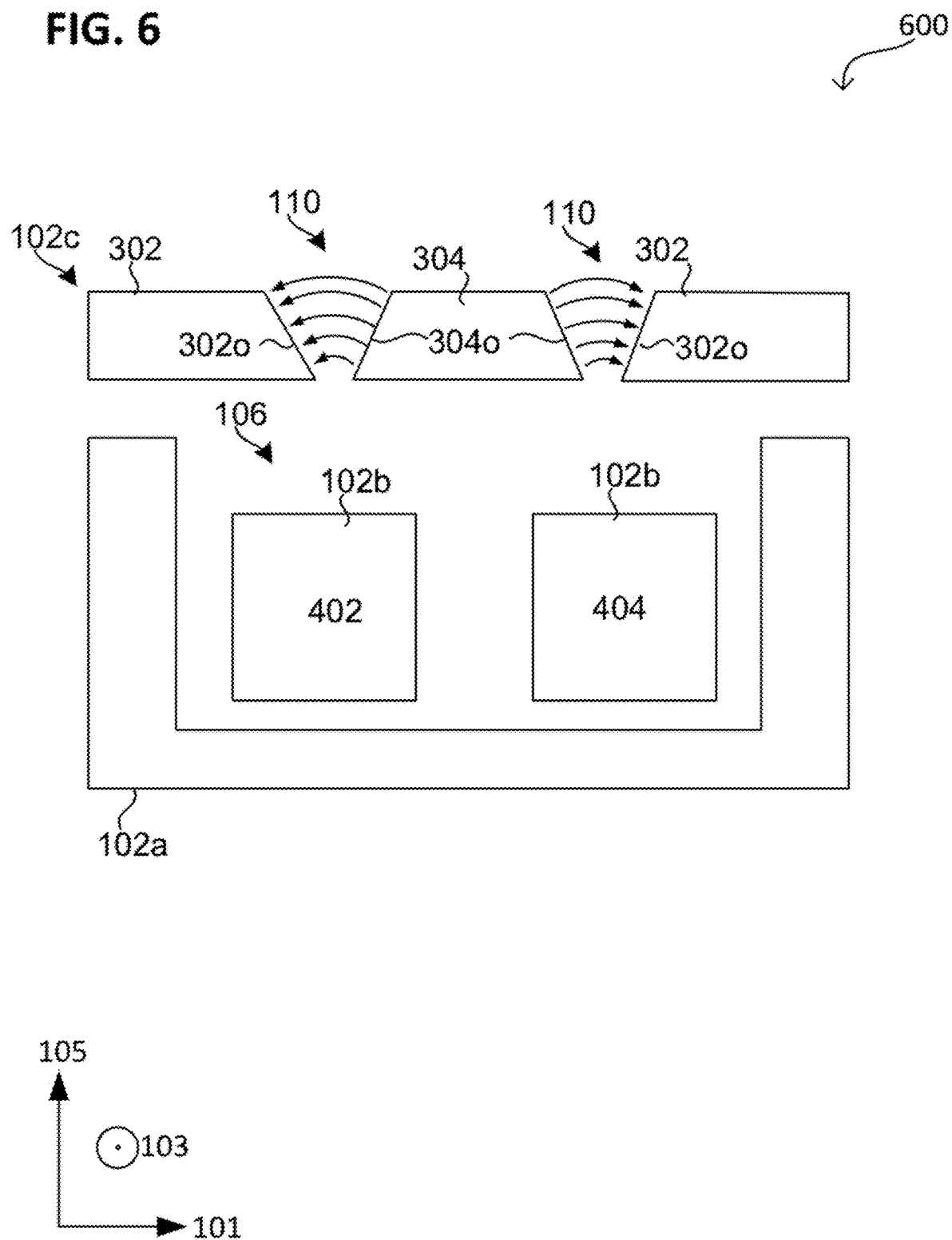

FIG. 6 illustrates an ion source 100 in accordance with various embodiments 600 in a schematic side view or cross-sectional view (with a view transverse to the direction 105), which can optionally be designed in accordance with one of the embodiments 200 to 500. In accordance with the embodiments 600, the slit 108 (also referred to as first slit 108), which passes through the third electrode 102*c*, is delimited on mutually opposite sides by faces 302*o*, 304*o* (also referred to as limiting faces or wall faces) of the third electrode 102*c* which run at an angle to one another. This optimizes the ion beam formation and minimizes parasitic sputtering effects on the third electrode 102*c* or the first segment 302 and second segment 304 thereof.

Figure 7:
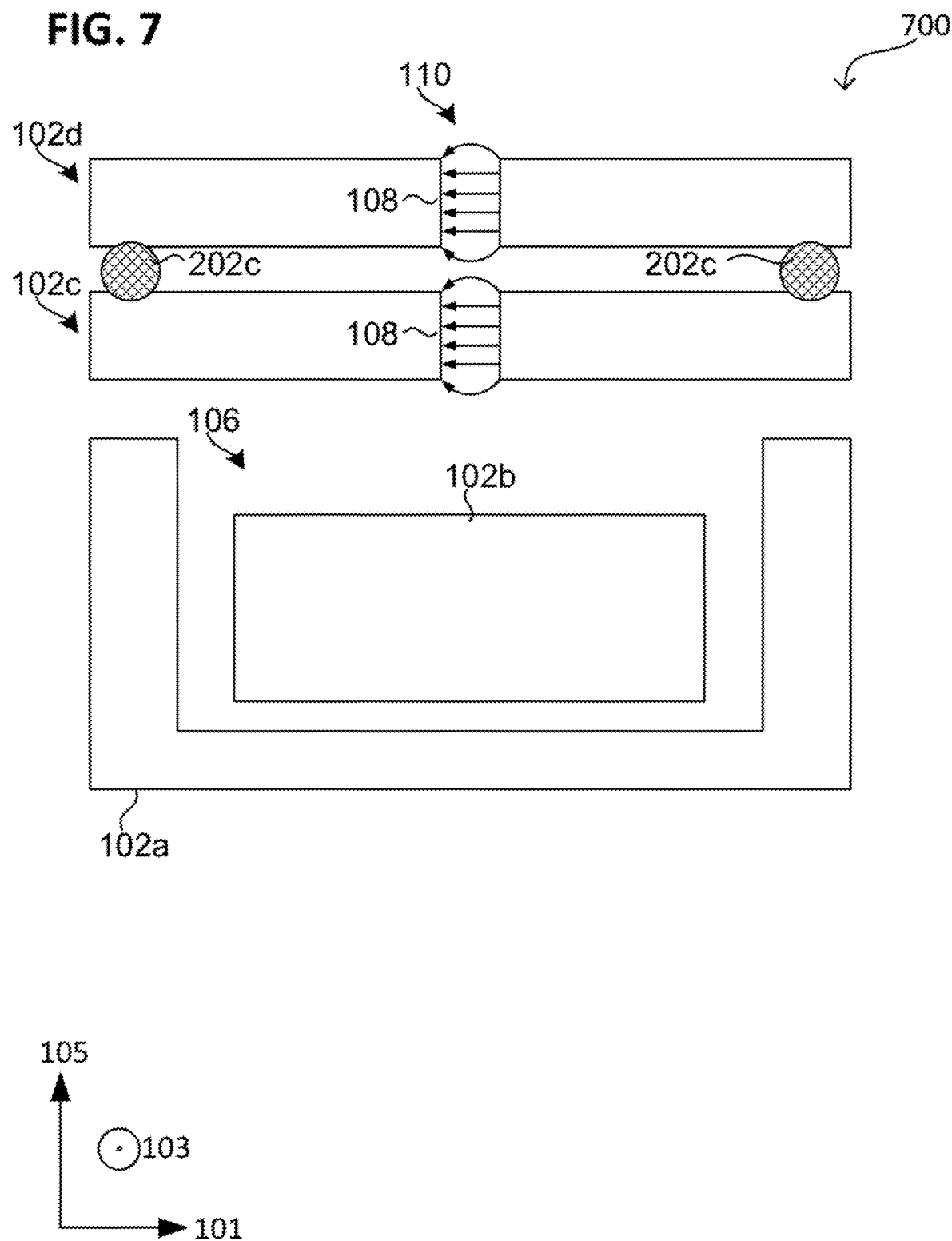

FIG. 7 illustrates an ion source 100 in accordance with various embodiments 700 in a schematic side view or cross-sectional view (with a view transverse to the direction 105), which can optionally be designed in accordance with one of the embodiments 200 to 600. In accordance with embodiments 700, the plurality of electrodes has a fourth electrode 102*d* (on a supplementary electrode). The fourth electrode 102*d* can be substantially designed in the same way as the third electrode 102*c* and/or be held by means of a corresponding third holding structure 202*c*. The fourth electrode 102*d* can be, for example, electrically (for example DC-isolated) and/or physically separated from the third electrode 102*c*.

The fourth electrode 102*d* can be, for example, magnetizable (for example ferromagnetic, for example soft-magnetic) or at least have a magnetizable (for example ferromagnetic, for example soft-magnetic) material, such as, for example, an iron-containing material. The fourth electrode 102*d* can have, for example, a greater magnetic permeability than the third electrode 102*c*.

The fourth electrode 102*d* can nevertheless also be nonmagnetic or at least have a nonmagnetic material. The fourth electrode 102*d* can have, for example, the same magnetic permeability as the second electrode 102*b*. The first electrode 102*a* and/or third electrode 102*c* can have, for example, a greater magnetic permeability than the fourth electrode 102*d*. This means that the plasma in the slit 108 of the third electrode 102*c* is generated therebeneath and achieves a correspondingly more local plasma generation. In this case, the magnetic field strength in the slit 108 of the third electrode 102*c* is greater than the magnetic field strength in the slit 108 of the fourth electrode 102*d* (which can, for example, substantially disappear or can be only a small leakage field).

The third electrode 102*c* can be arranged between the second electrode 102*b* and the fourth electrode 102*d*. An additional slit 108 (also referred to as second slit 108) can pass through the fourth electrode 102*d*, for example directed towards the second electrode 102*b*, and/or directed towards the first slit 108, (for example along a linear path, which runs along direction 105, for example).

The second slit 108, which passes through the fourth electrode 102d, can be delimited on mutually opposite sides, for example, by faces (also referred to as limiting faces) of the fourth electrode 102d which run at an angle to one another. Optionally, the limiting faces of the fourth electrode 102d can have a greater spacing from one another than the limiting faces of the third electrode 102c. This minimizes parasitic sputtering effects on the limiting faces of the fourth electrode 102d.

In the text which follows, further embodiments of the ion source 700 and operating modes thereof will be explained. In order to simplify understanding, shorter reference symbols are used.

FIG. 8 illustrates an ion source 100 in accordance with various embodiments 800 in a schematic side view or cross-sectional view (with a view transverse to the direction 105), which can optionally be designed in accordance with one of the embodiments 200 to 700. In the following text, the fourth electrode 102d (also referred to as electrode 1) is denoted by (1), the second electrode 102b is denoted by (2), optional water cooling of the second electrode 102b and/or the first electrode 102a is denoted by (3), a dielectric of the first holding structure 202a is denoted by (4), the first electrode 102a (also referred to as body) is denoted by (5), the slit 108 (also referred to as ion extraction slit) is denoted by (6), a permanent magnet of the magnetic field source 104 is denoted by (7), the magnetization direction of the magnetic field 110 is denoted by (8), an optional gas inlet is denoted by (9), a dielectric of the second holding structure 202b is denoted by (10), an optional wear body (also referred to as liner) of the second electrode 102b is denoted by (11), the third electrode 102 (also referred to as supplementary electrode or electrode 12) is denoted by (12).

A first operating mode (also referred to as AC voltage operating mode) of the ion source 100 can have the same electrical potential 802 (for example a reference potential 802) being provided to the first electrode 102a and the fourth electrode 102d, for example by virtue of them being subjected to the same (for example temporally invariant) electrical voltage (for example a reference voltage). The reference potential can be electrical earth, for example. In other words, a voltage difference between the first electrode 102a and the fourth electrode 102d can be substantially zero. The fourth electrode 102d can also be operated in electrically floating fashion independently of the first electrode 102a. If the fourth electrode 102d is not present, the reference voltage 802 can only be applied to the first electrode 102a.

The voltage values or potential values specified herein can be based on the reference potential, for example even if this is different from electrical earth. In other words, the reference voltage can have a value of zero. An electrical voltage specified herein can correspond to a corresponding electrical potential which differs from the reference potential by the value of the electrical voltage, and vice versa.

The first operating mode can further comprise providing a temporally variable voltage difference 804 between the second electrode 102b and the third electrode 102c. The temporally variable voltage difference 804 may be, for example, a pulsating voltage or an AC voltage.

The temporally variable voltage difference 804 can generally have a greater temporal variability than the electrical voltage which has been applied to the first electrode 102a and/or the fourth electrode 102d. For example, the electrical voltage which has been applied to the first electrode 102a and/or the fourth electrode 102d can have a smaller rate of change (voltage change per unit time) than the temporally variable voltage difference 804, for example a rate of change of zero.

A pulsating voltage can be understood to mean superimposition of an AC voltage and a DC voltage. If the DC voltage of the pulsating voltage is zero, an AC voltage is achieved. A pulsating voltage can therefore have a DC voltage unequal to zero.

The first operating mode can optionally additionally comprise supplying a gas to the depression 106, for example by means of the gas inlet (9). The gas can flow, for example, through the slit 108 and/or additional slit 108. Ionization of the gas can take place in the slit 108 and/or additional slit 108, with the result that a plasma is formed there. The ions of the plasma can be emitted in direction 105.

A frequency (also referred to as AC frequency) of the temporally variable voltage difference 804 can be, for example, in a range of from approximately 0.1 Hz (hertz) to approximately 1000 kHz, for example in a range of from approximately 0.5 kHz (kilohertz) to approximately 50 kHz. An amplitude of the temporally variable voltage difference 804 can be, for example, in a range of from approximately 1 kV (kilovolt) to approximately 5 kV, for example in a range of from approximately 2 kV to approximately 3 kV. An arithmetic mean over time (for example measured over a plurality of changes, for example periods) of the temporally variable voltage difference 804 may be, for example, zero (ostenisvely when this is an AC voltage).

The first operating mode achieves that the second electrode 102b is cleaned periodically, as will be described more precisely later.

In one example, the ion source has one or more than one supplementary electrode (12), (1), for example mounted in electrically isolated fashion, for example the third electrode and/or the fourth electrode (1). The or each supplementary electrode (12) can perform, for example, the function of the conventional acceleration electrode (1). The third electrode (12) consists of a ferromagnetic (for example soft-magnetic), electrically conductive material, preferably steel or graphite. The fourth electrode (1) remains, as does the first electrode (5), at earth potential and consists of an electrically conductive material. The fourth electrode (1) can optionally be operated in electrically floating fashion. The fourth electrode (1) is preferably non-ferromagnetic. The shape of the fourth electrode (1) follows the bevelled opening of the slit (6) (also referred to as ion extraction slit) of the third electrode. The first electrode (5) preferably consists of a ferromagnetic (for example soft-magnetic) material, for example steel. The electrodes ((1), (2) and (12) are held electrically isolated from one another by means of dielectrics (10).

FIG. 9 illustrates an ion source 100 in accordance with various embodiments 900 in a schematic side view or cross-sectional view (with a view transverse to the direction 105), which can optionally be designed in accordance with one of the embodiments 200 to 800.

A second operating mode (also referred to as DC voltage operating mode) of the ion source 100 can comprise providing the same electrical potential 802 (for example a reference potential 802) to the first electrode 102a and the second electrode 102b, for example by virtue of the same (for example temporally invariant) electrical voltage (for example a reference voltage) being applied to said electrodes. The reference potential may be electrical earth, for example. In other words, a voltage difference between the first electrode 102a and the second electrode 102c can be substantially zero.

The second operating mode can furthermore comprise providing a temporally invariant voltage difference 806 between the first electrode 102*a* and the third electrode 102*c*. The temporally invariant voltage difference 806 may be, for example, a DC voltage.

The temporally invariant voltage difference 806 can have substantially the same temporal variability as the electrical voltage which has been applied to the first electrode 102*a* and/or the second electrode 102*b*. For example, the electrical voltage which has been applied to the first electrode 102*a* and/or the second electrode 102*b* or the temporally invariant voltage difference 806 can have a rate of change of zero.

If the fourth electrode 102*d* is present, said electrode can be DC-isolated from the first electrode 102*a* and/or the third electrode 102*c*, for example completely DC-isolated (also referred to as electrically floating). This achieves a situation whereby the fourth electrode 102*d* exerts an improved shielding effect in comparison with the third electrode 102*c* and permits optimization of the ion beam formation. The fourth electrode 102*d* can therefore exchange electrical charges now only via free charge carriers outside the slit 108, with the result that the electrical potential thereof is coupled to that of the plasma outside of the slit 108.

The second operating mode can optionally additionally comprise supplying a gas to the depression 106. The gas can flow, for example, through the slit 108 and/or additional slit 108. In the slit 108 and/or additional slit 108, ionization of the gas can take place, with the result that a plasma is formed. The ions of the plasma can be emitted in direction 105.

The DC voltage operating mode enables extraction of low-energy ions at the substrate (also referred to as low-ion energy operating mode), as will be described in more detail later.

FIG. 10 illustrates an ion source 100 in accordance with various embodiments 1000 in a schematic side view or cross-sectional view (with a view transverse to the direction 105), which can optionally be designed in accordance with one of the embodiments 200 to 900. In accordance with the embodiments 1000, the third electrode 102*c* and the fourth electrode 102*d* substantially correspond to one another in terms of the spacing 1004 (also referred to as limiting spacing) between their limiting faces (also referred to as shielding configuration). The shielding configuration achieves a situation whereby the fourth electrode 102*d* substantially completely overlaps the third electrode 102*c*, with the result that the shielding of the third electrode 102*c* is maximized, and the electrical potential and the effectiveness of the fourth electrode 102*d* is better incorporated in the entire configuration.

Optionally, the third electrode 102*c* and the fourth electrode 102*d* can differ from one another in terms of the angle 1002 (also referred to as limiting angle) at which the limiting faces run towards one another. For example, the third electrode 102*c* can have a smaller limiting angle 1002 than the fourth electrode 102*d*. For example, the third electrode 102*c* can have a limiting angle of substantially zero. For example, the fourth electrode 102*d* can have a limiting angle in a range of from approximately 60° to approximately 120°, for example approximately 90°.

For example, the supplementary electrode (12) can have a constant limiting spacing of the emission slit (6). The limiting spacing of the fourth electrode 102*d* (also referred to as shielding electrode) can be matched thereto.

This achieves, for example, an improved ion extraction in the AC voltage operating mode. The ion source 100 in accordance with the embodiments 1000 can of course also be operated in the DC operating mode.

In the shielding configuration, the emission slit (6) which passes through the third electrode (12) can be embodied over the entire thickness of the third electrode (12) without any bevels, for example. The limiting spacing 1004 (also referred to as slit width) can then be constant over the entire thickness of the third electrode (12). At the same time, the slit width 1004 of the emission slit (6) of the fourth electrode (1) can be matched at the base thereof to the slit width 1004 of the third electrode (12) therebeneath, for example whilst maintaining the bevelled side walls 302*o*, 304*o*, which delimit the extraction opening (6), of the fourth electrode (1).

FIG. 11 illustrates an ion source 100 in accordance with various embodiments 1100 in a schematic side view or cross-sectional view (with a view transverse to the direction 105), which can optionally be designed in accordance with one of the embodiments 200 to 1000. In accordance with the embodiments 1100, the ion source 100 has the fourth electrode 102*d* and in addition dark field shielding 1102. In principle, again optionally the DC voltage operating mode and the AC voltage operating mode are possible.

The dark-field shielding 1102 can have, for example, one or more than one wall element, which makes physical contact with the first electrode 102*a* and/or the fourth electrode 102*d* and/or electrically couples them to one another.

The dark-field shielding 1102 can be arranged, for example, so as to be electrically and/or physically separated from the third electrode 102*c*.

The dark-field shielding 1102 can have, for example, two wall elements, between which four electrodes of the plurality of electrodes 102*a*, 102*b*, 102*c*, 102*d* are arranged. The dark-field shielding in this way suppresses a parasitic plasma formation at the end faces of the third electrode 102*c* outside the ion source.

The third electrode (12) can be integrated, for example, in the ion source 100 in such a way that no parasitic plasma discharges occur outside and inside the ion source 100. In the interior of the ion source 100, the dark-field spacing required for this purpose between mutually directly adjacent component parts of different electrical potentials can be in a range of from approximately 0.5 mm (millimetre) to approximately 2 mm or approximately 3 mm. In the exterior of the ion source 100, the supplementary electrode (12) can be covered, for example, by the dark-field shielding (14), preferably consisting of an electrically conductive material.

As an alternative or in addition to a separate dark-field shielding, the dark-field shielding can also be an integral part of the first electrode 102*a*.

Figure 12:
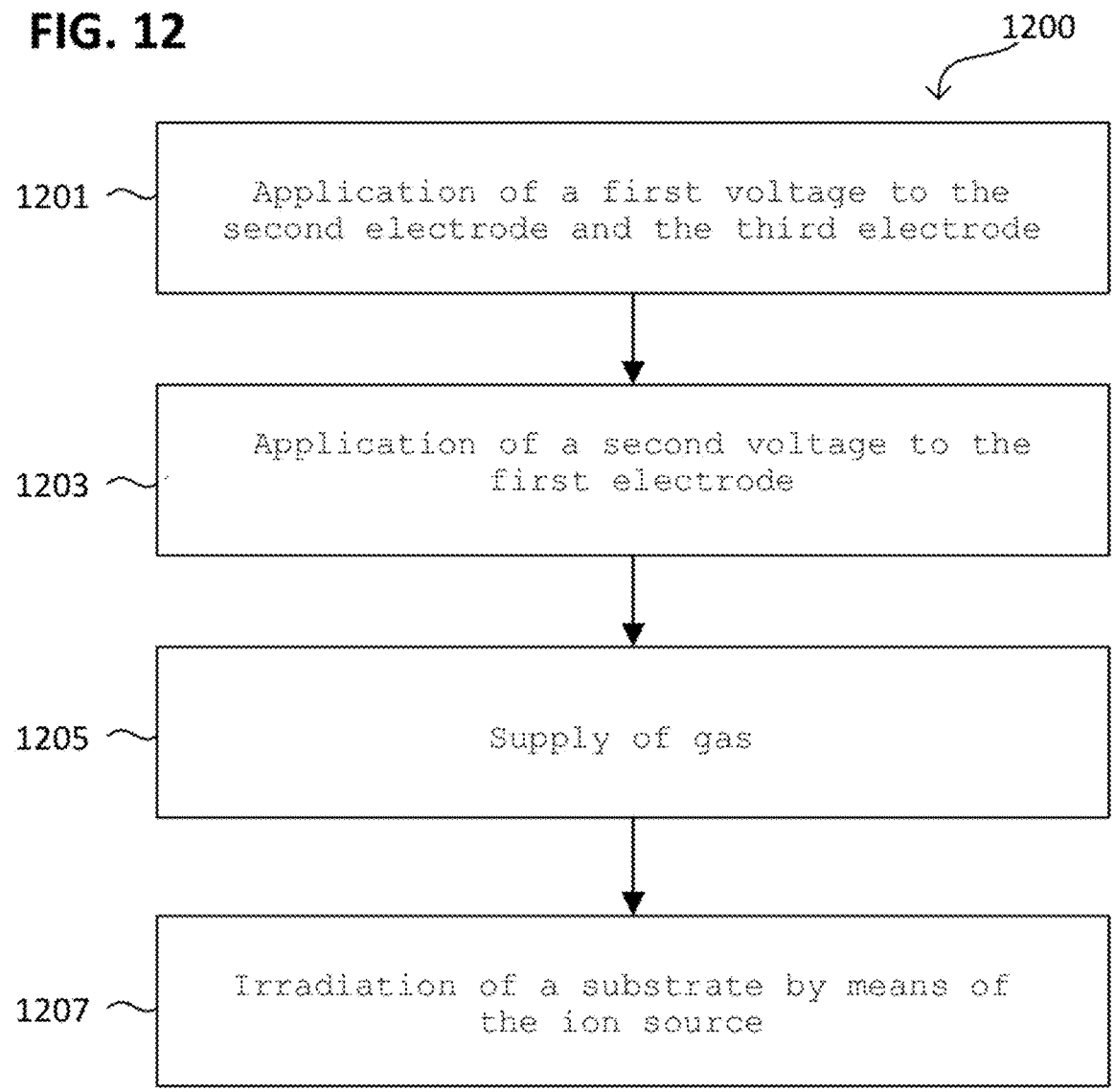
FIGS. 12 to 15 each show a method in accordance with various embodiments in a schematic flowchart.

FIG. 12 illustrates a method 1200 in accordance with various embodiments in a schematic flowchart for driving an ion source 100, which can optionally be designed in accordance with one of the embodiments 200 to 1100. The method 1200 can drive the ion source 100 ostensively in accordance with the AC voltage operating mode. The method 1200 can be implemented, for example, by means of a control apparatus.

The method 1200 comprises, in 1201, application of a first voltage to the second electrode 102*b* and/or to the third electrode 102*c*; in 1203, application of a second voltage (for example electrical earth) to the first electrode 102*a* and optionally to the fourth electrode 102*d* (if present); and optionally in 1205, supply of gas so that the gas flows through the slit; and optionally in 1207, irradiation of a substrate by means of the ion source 100 (for example by means of the ions emitted by the ion source).

The first voltage and the second voltage may be different from one another, for example in terms of their time-dependency, and/or have a spacing from one another. For example, a polarity of the first voltage with respect to the second voltage can alternate a plurality of times (for example with a regular repetition). For example, the first voltage may be a pulsating voltage or an AC voltage. For example, the second voltage may be a DC voltage or a reference voltage.

In an exemplary AC voltage operating mode (see, for example, FIG. 8), an AC voltage is present between the second electrode 102b and the third electrode 102c, and electrical earth is present at the first electrode 102a and (if present) the fourth electrode 102d.

Figure 13:
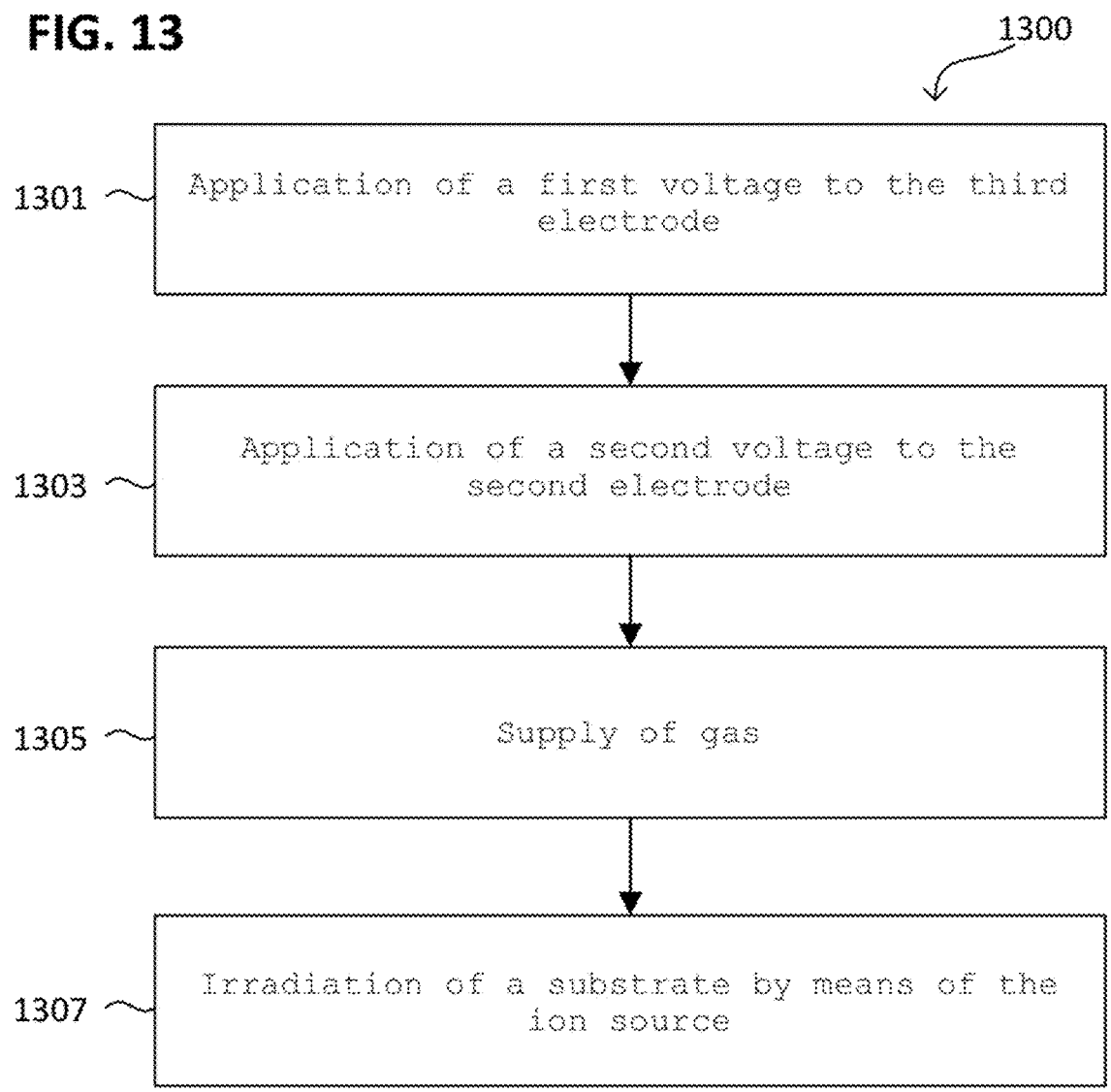

FIG. 13 illustrates a method 1300 in accordance with various embodiments in a schematic flowchart for driving an ion source 100, which can optionally be designed in accordance with one of the embodiments 200 to 1100. The method 1300 can drive the ion source 100 ostenisvely in accordance with the DC voltage operating mode. The method 1300 can be implemented, for example, by means of a control apparatus.

The method 1300 comprises, in 1301, application of a first voltage to the third electrode 102c;

in 1303, application of a second voltage (for example electrical earth) to the second electrode and/or to the first electrode; and optionally in 1305, supply of gas so that the gas flows through the slit; and optionally in 1307, irradiation of a substrate by means of the ion source 100 (for example by means of the ions emitted by the ion source).

The first voltage and the second voltage may be different from one another, for example have a spacing from one another. For example, a polarity of the first voltage with respect to the second voltage may be temporally invariant, for example while a plasma is formed. As an alternative or in addition, a difference between the first voltage and the second voltage may be temporally invariant. For example, the first voltage may be a DC voltage. For example, the second voltage may be another DC voltage or the reference voltage.

The fourth electrode (if present) can be DC-isolated from the first voltage and from the second voltage.

Figure 14:
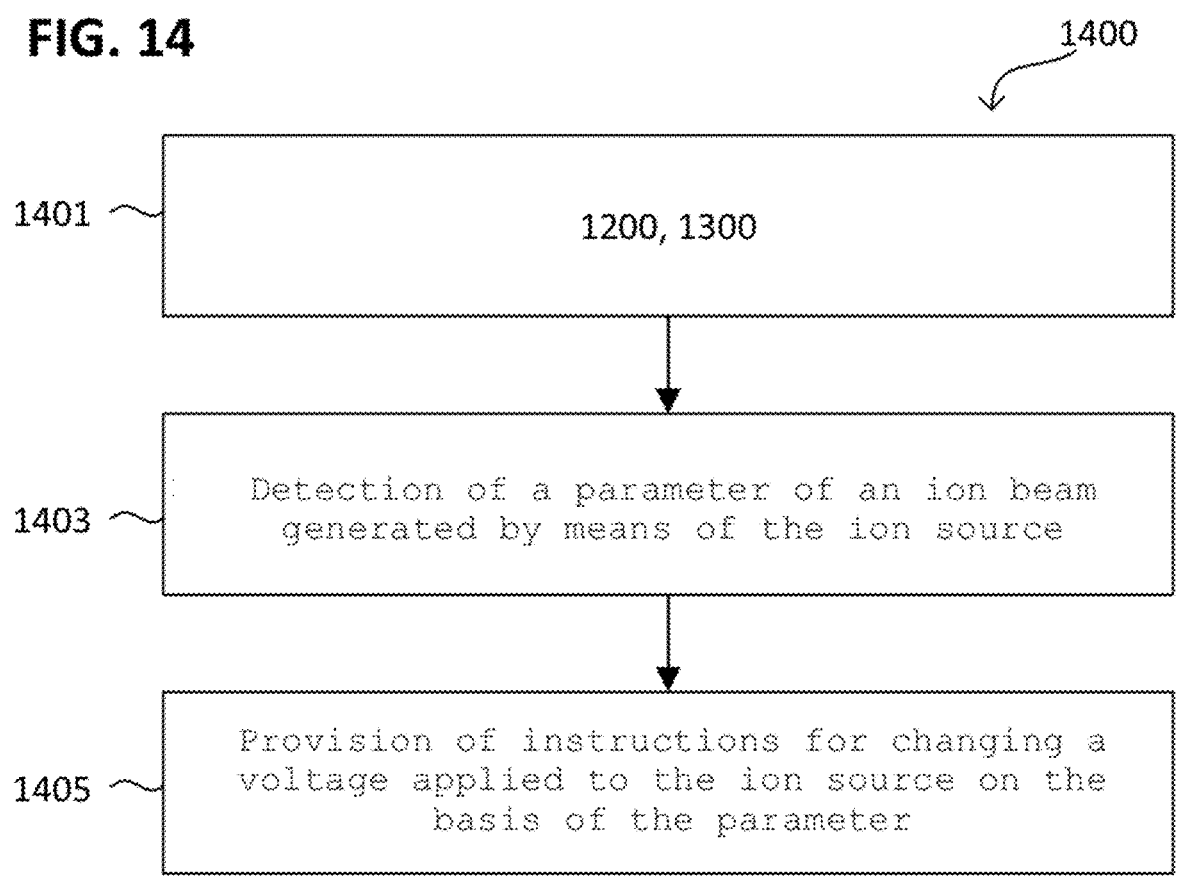

FIG. 14 illustrates a method 1400 in accordance with various embodiments in a schematic flowchart for driving an ion source 100, which can optionally be designed in accordance with one of the embodiments 200 to 1100. The method 1400 can comprise, in 1401, the method 1200 or 1300. The method 1400 can be implemented, for example, by means of a control apparatus.

The method 1400 can furthermore comprise, in 1403, detection of a parameter, for example a parameter of the ion beam generated by means of the ion source; and in 1405, provision of instructions for changing a voltage applied to the ion source 100 (for example the third electrode and/or fourth electrode thereof) on the basis of the parameter.

The parameter can represent, for example, a state of the ion source itself (then also referred to as internal parameter) or a state which is external from the ion source (then also referred to as external parameter).

The internal parameter can represent, for example, a variable which is supplied to the ion source. For example, for the internal parameter there are: electrical power (i.e. product of discharge voltage and discharge current), discharge current, discharge voltage and/or the state of a gas which is supplied to the ion source (for example the pressure (also referred to as process pressure), flow and/or chemical composition thereof).

The external parameter can represent, for example, a state of a gas to which the ion source and/or the substrate is subjected, for example the pressure (also referred to as process pressure), flow and/or chemical composition thereof.

The external parameter can as an alternative or in addition represent a state of the ion beam. For example, for the parameter there are: a quantity of ions per unit time which are emitted by means of the ion beam (also referred to as emission rate), an average energy per ion which is emitted by means of the ion beam (also referred to as emission energy), a total power which is emitted by means of the ion beam (also referred to as emission power); a beam divergence of the ion beam, an ion density of the ion beam. This results in closed-loop control of the ion beam being implemented.

The external parameter can as an alternative or in addition represent a state of a substrate irradiated by means of the ion beam 100. For example, for the parameter there are: a temperature of the substrate, an electrical voltage of the substrate, a (for example chemical and/or physical) structure of the substrate which is influenced by means of the irradiation, a change in the substrate which is effected by means of the irradiation. This results in closed-loop control of the substrate treatment being implemented.

In one example, the ion source is operated with a temporally constant discharge voltage, and the discharge power of the ion source is adjusted and/or subjected to closed-loop control via the gas flow (for example the quantity of gas per unit time) which is supplied to the ion source.

In one example, as an alternative or in addition to the change in voltage, the change in power and/or the change in current can also be used as controlled variable (also referred to as reference variable).

Figure 15:
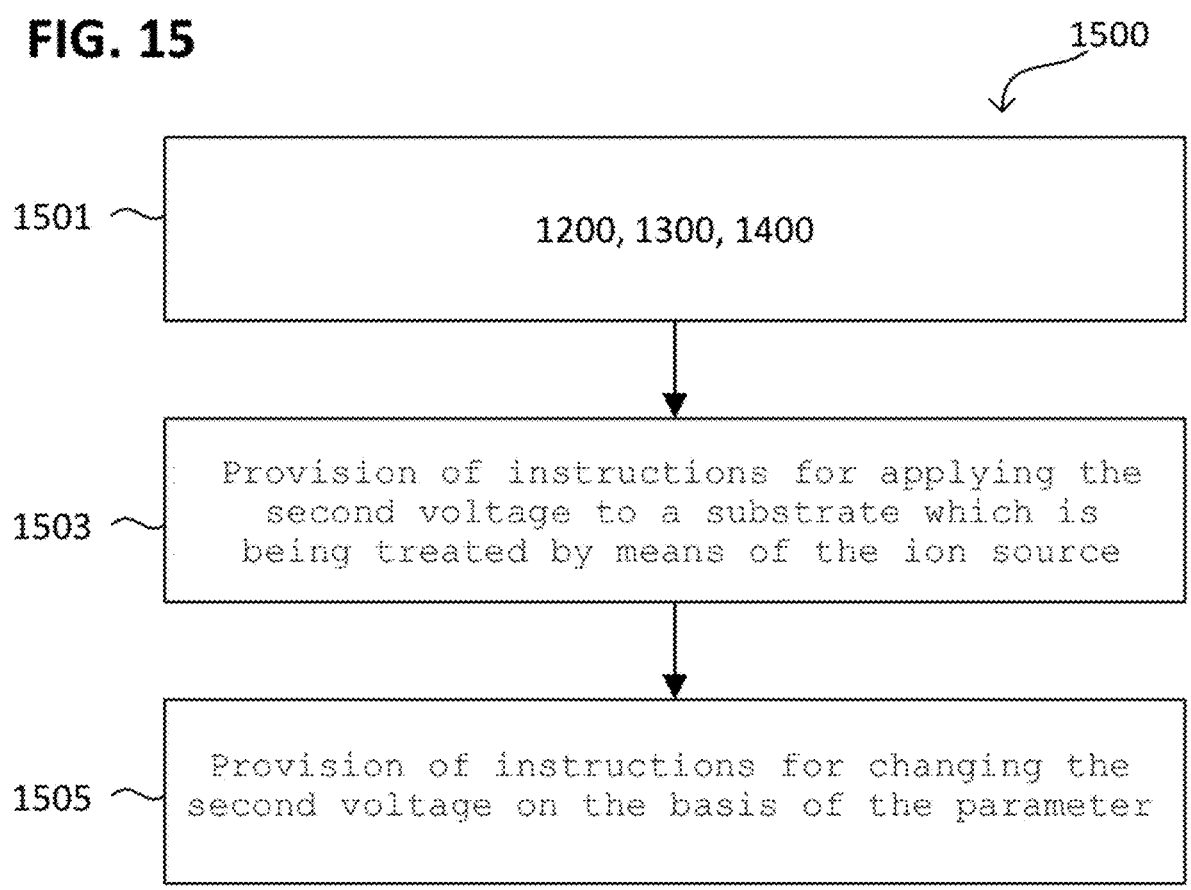

FIG. 15 illustrates a method 1500 in accordance with various embodiments in a schematic flowchart for driving an ion source 100, which can be designed, for example, in accordance with one of the embodiments 200 to 1100. The method 1500 can comprise, in 1501, one of the methods 1200 to 1400. The method 1500 can be implemented, for example, by means of a control apparatus.

The method 1500 can furthermore comprise, in 1503, provision of instructions for applying the second voltage to a substrate which is being treated by means of the ion source; and optionally in 1505, provision of instructions for changing the second voltage on the basis of the parameter.

Figure 16:
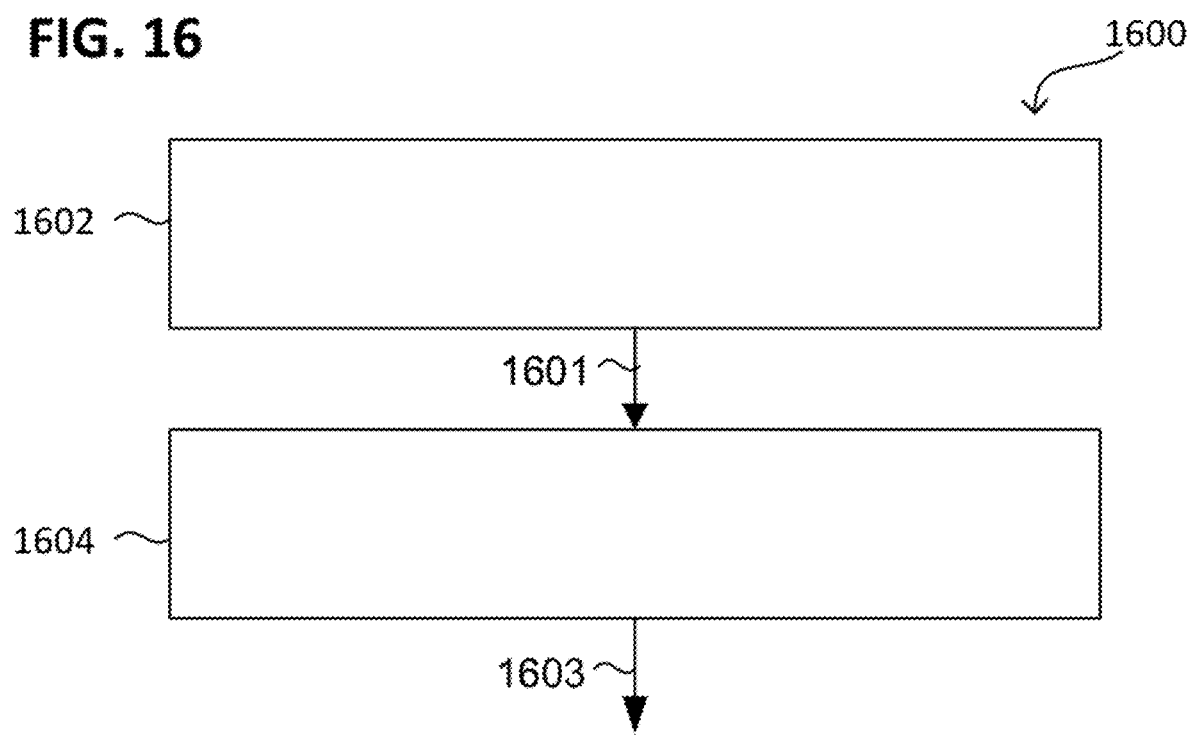
FIG. 16 shows a drive arrangement in accordance with various embodiments in a schematic control diagram.

FIG. 16 illustrates a drive arrangement 1600 in accordance with various embodiments in a schematic control diagram. The drive arrangement 1600 can have a control apparatus 1602. The control apparatus 1602 can be designed to implement one of the methods 1200 to 1500. For this purpose, the control apparatus 1602 can have a processor, which is designed to implement one of the methods 1200 to 1500. For example, the processor can be designed to output corresponding instructions.

As an alternative or in addition, the processor can be designed to pick up and process corresponding instructions. These instructions can be implemented, for example, by means of code segments. For example, the code segments can have instructions which, when executed by the processor, cause the processor to perform one of the methods 1200 to 1500.

The term "control apparatus" can be understood to be any type of logic-implementing entity which can have, for example, an interconnection and/or a processor which can run software, for example, which is stored in a storage medium, in a firmware or in a combination thereof and can output instructions on the basis of this. The control apparatus can be configured, for example, by means of code segments (for example software). The control apparatus can have, for example, a programmable logic controller (PLC) or can be formed therefrom.

If a method is implemented by means of the control apparatus described herein, it can be understood that this control apparatus is designed to provide (and output, for example) corresponding instructions for performing one or more than one component of the method, for example application of a voltage.

In accordance with various embodiments, a data store (more generally also referred to as storage medium) may be a non-volatile data store. The data store may have, for example, a hard disk and/or at least one semiconductor memory (such as, for example, read-only memory, random-access memory and/or flash memory) or may be formed therefrom. The read-only memory may be, for example, an erasable programmable read-only memory (can also be referred to as EPROM). The random-access memory may be a non-volatile random-access memory (can also be referred to as NVRAM). For example, one or more than one of the following can be stored in the data store: the code segments which represent the method, one or more than one parameter of the method.

The term "processor" can be understood to mean any type of entity which allows processing of data or signals. The data or signals can be handled, for example, in accordance with at least one (i.e. one or more than one) specific function which is executed by the processor. A processor may have an analogue circuit, a digital circuit, a mixed-signal circuit, a logic circuit, a microprocessor, a central processing unit (CPU), a graphics processing unit (GPU), a digital signal processor (DSP), a programmable gate array (FPGA), an integrated circuit or any desired combination thereof or may be formed therefrom. Any other type of implementation of the respective functions which will be described in more detail below can also be understood as a processor or logic circuit, for example also virtual processors (or a virtual machine) or a multiplicity of decentralized processors, which are connected to one another, for example, by means of a network, are distributed in any desired spatial fashion and/or have any desired levels of involvement in the implementation of the respective functions (for example computation load distribution amongst the processors). The same generally applies to a logic implemented in a different way for implementing the respective functions. It goes without saying that one or more of the method steps described in detail herein can be executed (for example realized) by a processor, by means of one or more specific functions which are executed by the processor.

The instructions 1601 output by the control apparatus 1602 can be supplied, for example, to a voltage source 1604 (if present) of the drive arrangement 1600. The voltage source 1604 can be designed to generate and output one or more than one voltage 1603 (for example the first voltage and/or the second voltage) in accordance with the instructions 1601.

Figure 17:
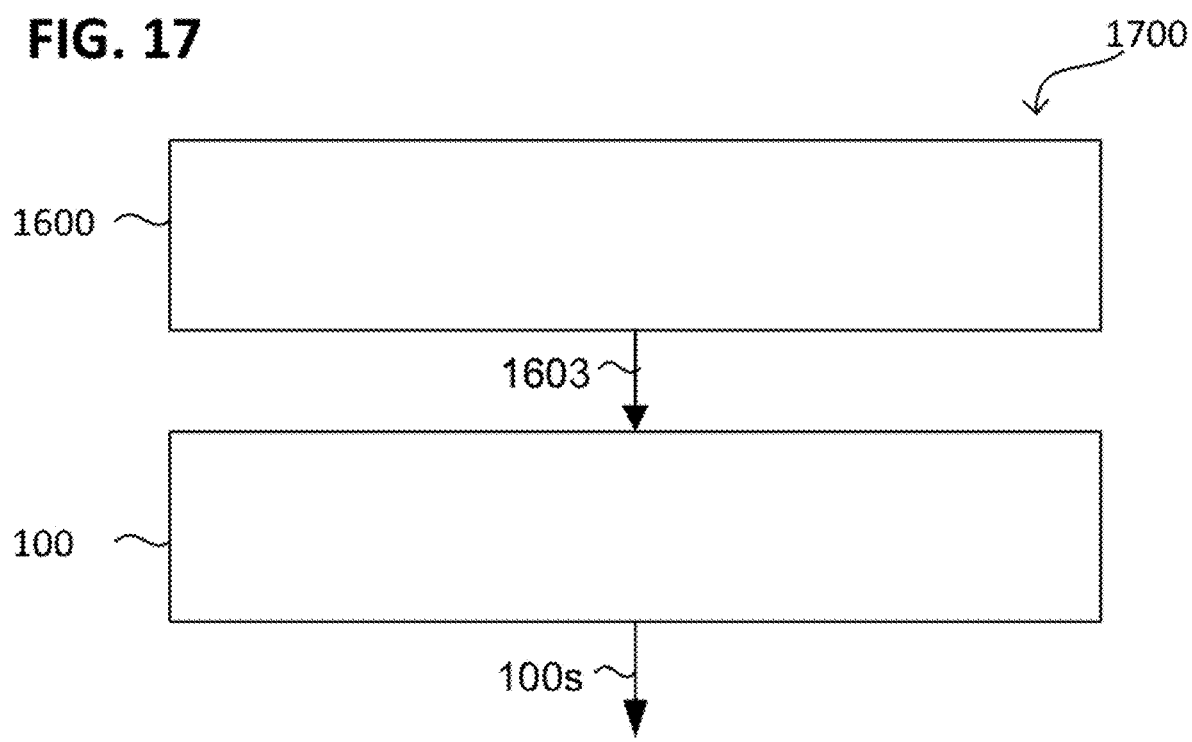
FIGS. 17 and 18 each show a processing arrangement in accordance with various embodiments in a schematic process diagram.

FIG. 17 illustrates a processing arrangement 1700 in accordance with various embodiments in a schematic process diagram, wherein the processing arrangement 1700 has the drive arrangement 1600 and the ion source 100.

The voltage source 1604 can be designed to generate the one or more than one voltage 1603 (for example the first voltage and/or the second voltage) and to supply it to the ion source 100, for example to apply it to one or more than one electrode of the ion source 100. For example, the voltage source 1604 can be designed to provide and/or change the voltage 1603 applied to the second electrode 102b and/or the voltage 1603 applied to the third electrode 102c. For example, the voltage source 1604 can be designed to change the voltage 1603 applied to the second electrode 102b and/or to the third electrode 102c in accordance with the instructions 1601 output by the control apparatus 1602.

For example, the voltage source 1604 can be designed to provide and/or change the voltage 1603 applied to the fourth electrode 102d. For example, the voltage source 1604 can be designed to change the voltage 1603 applied to the fourth electrode in accordance with the instructions 1601 output by the control apparatus 1602.

In other words, the voltage 1603 can act as manipulated variable 1603, by means of which the ion beam 100s can be subjected to open-loop and/or closed-loop control. However, it can be understood that, as an alternative or in addition to a voltage 1603, an electrical current supplied to the ion source, or to the respective electrode, can act as manipulated variable 1603. In more general terms, examples of the manipulated variable comprise: an electrical power (i.e. product of discharge voltage and discharge current), a discharge current, a discharge voltage and/or the state of a gas which is supplied to the ion source (for example the pressure, flow and/or chemical composition thereof).

The ion source 100 can provide the ion beam 100s as a function of one or more than one manipulated variable 1603 which is supplied to the ion source 100. For example, the state of the ion beam 100s may be a function of the one or more than one manipulated variable 1603, for example the voltage applied to the third electrode 102c and/or to the fourth electrode 102d.

In one example, the ion beam 100s is provided as a function of the discharge current (or ion current) or the discharge power, given a constant voltage.

For example, the current and the power may be a function of the manipulated variable of the process pressure and the manipulated variable of the applied voltage.

Figure 18:
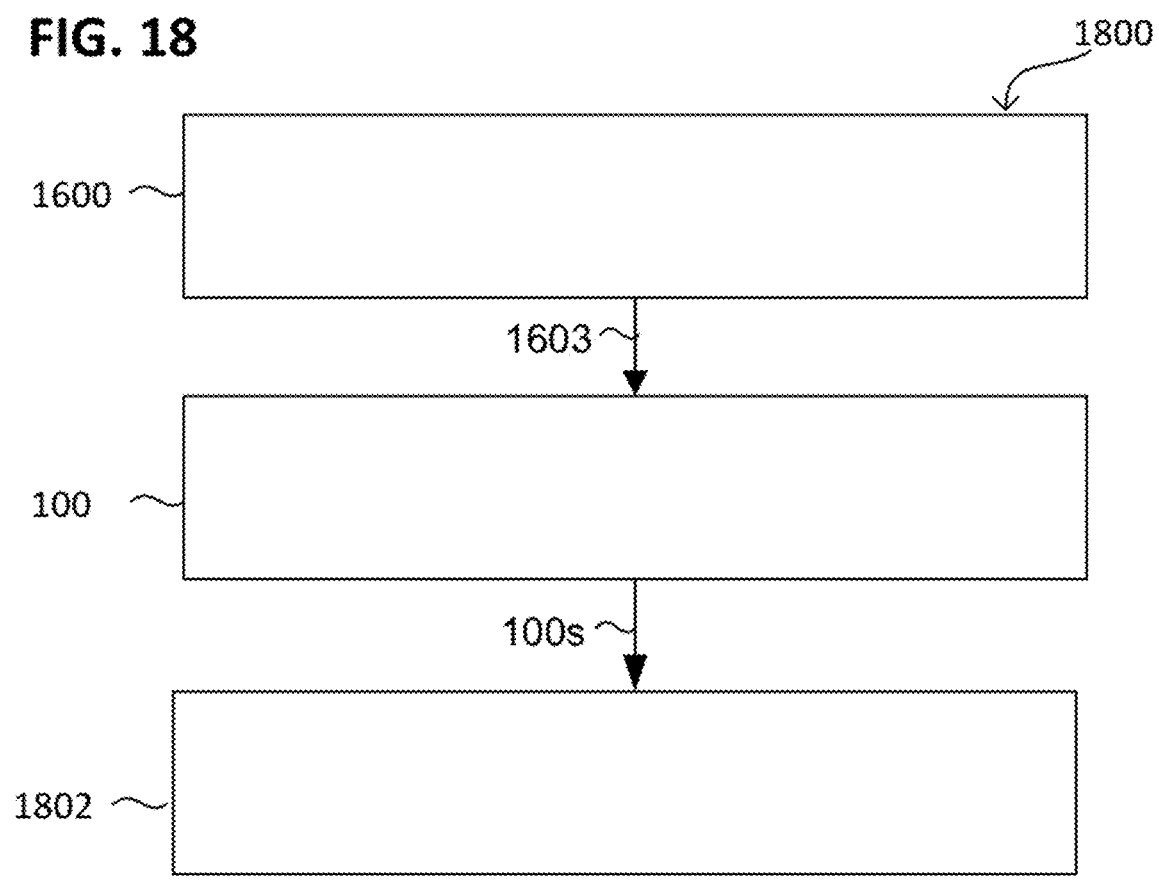

FIG. 18 illustrates the processing arrangement in accordance with various embodiments 1800 in a schematic process diagram, in which the processing arrangement additionally has the substrate 1802, which is irradiated by means of the ion beam 100s.

In the text which follows, a plurality of exemplary implementations of the AC operating mode or the DC operating mode will be explained.

FIG. 19 illustrates an exemplary implementation of the AC operating mode 1900 in accordance with various embodiments in a plurality of schematic graphs, of which a first graph 1901 represents a voltage 1901 (for example in volts) over time t (for example in seconds). The voltage characteristic 1902 plotted in the first graph 1900 can represent the temporally variable voltage which has been or is being applied to the second electrode 102b (also referred to as electrode 2).

As can be seen, the AC operating mode 1900 can take place in accordance with a sequence which is repeated. The sequence can have two phases (ostenisvely also referred to as cathode phase 154 and anode phase 152), which differ from one another in terms of a polarity of the temporally variable voltage 1902. This results in the second electrode 102b being operated alternately as cathode (in the cathode phase 154) and anode (in an anode phase 152).

A second graph 1903 and third graph 1905 each illustrate the electrical voltage 1901 along a path x (for example in metres) which runs from the first electrode 102*a* to the substrate. The second graph 1903 illustrates the state in the anode phase 152 and the third graph 1905 illustrates the state in the cathode phase 154. Dashed lines represent a corresponding floating potential.

In the anode phase 152, ions are emitted by the ion source 100 (also referred to as ion extraction) in direction 105 towards the substrate, i.e. the plasma is the source of ions emitted away from the ion source 100 (also referred to as ion source operating mode). In the cathode phase 154, the ions of the plasma are taken up 151 by the ion source 100, for example in direction 115 towards the second electrode 102*b*, i.e. the second electrode 102*b* provides an ion sink (also referred to as ion sink operating mode or cleaning operating mode). The ions taken up effect a bombardment of the second electrode 102*b* with ions, which removes material from said electrode (also referred to as cleaning of the second electrode 102*b*).

In the ion source operating mode, the electrode 2 can be operated as anode and the electrode 12 can be operated as cathode. In the cleaning operating mode, the electrode 12 can be operated as anode and the electrode 2 can be operated as cathode.

In one example, the ion source is operated by means of an AC voltage between the second electrode (2) and the third electrode (12), for example having an amplitude of more than 1 kV (for example up to ±5 kV), while the fourth electrode (1) and the first electrode (5) are at earth potential. The fourth electrode (1) can also be operated in electrically floating fashion, however. The fourth electrode (1) preferably consists of an electrically conductive material.

For example, the frequency of the AC voltage is in a range of between approximately 0.1 Hz (hertz) and approximately 1000 kHz.

The AC voltage or the AC voltage pulse thereof can be bipolar and sinusoidal, stepped, trapezoidal or square-wave. The AC voltage can have symmetrical or asymmetrical magnitudes and/or pulse durations. The AC voltage can optionally have OFF times between the individual pulses in a period.

In the anode phase 152, i.e. while the second electrode (2) is being operated as anode and the third electrode (12) is being operated as cathode, the plasma source operates in the ion source operating mode, and ions with energies in the keV range can be extracted from the slit (6) (also referred to as emission opening) and supplied to the substrate to be treated.

In the cathode phase 154, i.e. while the second electrode (2) is being operated as cathode and the third electrode (12) is being operated as anode, the plasma source operates in the cleaning operating mode, and the surface of the second electrode (2) has material removed from it (for example is sputtered) by bombardment with the ions generated in the plasma and therefore is freed of deposits. This results, for example, in the second electrode remaining free from a parasitic coating.

Since the surface of the second electrode (2) can be attacked during the cleaning operating mode, the electrode can have an easily replaceable wear body (11) (a so-called liner), which faces the slit 108. The liner is electrically conductive or has an electrically conductive material or is formed therefrom and/or can be nonmagnetic (for example non-ferromagnetic).

Figure 20:
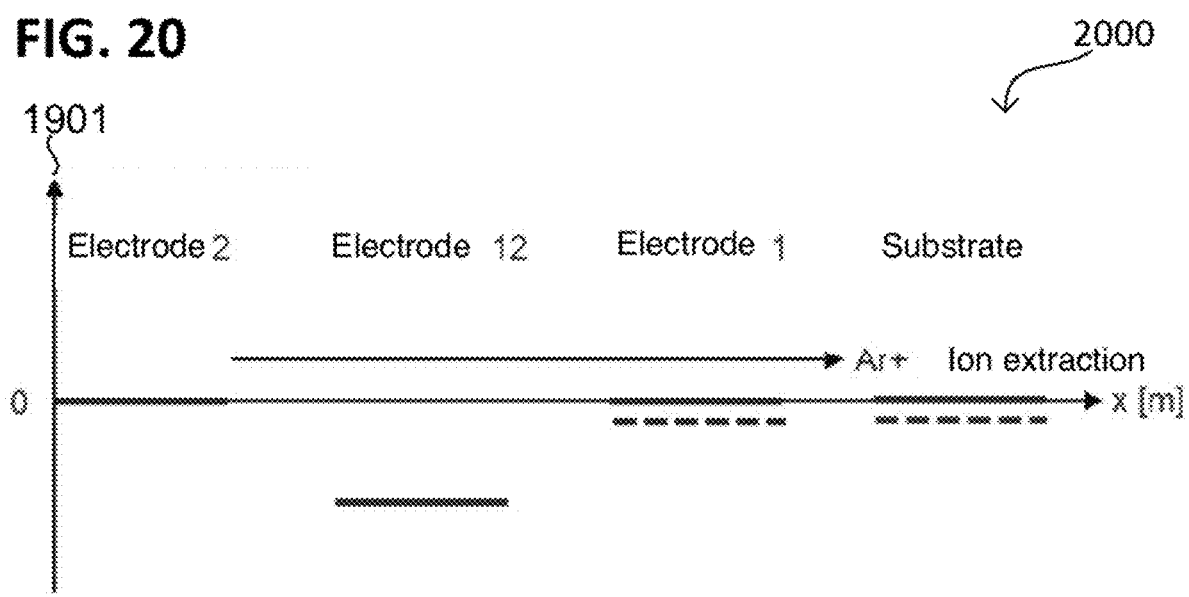

FIG. 20 illustrates an exemplary implementation of the DC operating mode 2000 in accordance with various embodiments in a schematic graph, which illustrates the electrical voltage 1901 along the path x (for example in metres) which leads from the second electrode 102*b* to the substrate. Ostensively, the second electrode 102*b* and the substrate are substantially at the same electrical potential, with the result that the ions which have covered the path from the second electrode 102*b* to the substrate are substantially decelerated to a speed of or close to zero. This effects minimization of the kinetic energy per ion which is transmitted to the substrate on impact of the ions. In other words, this DC operating mode 2000 achieves the extraction of low-energy ions at the substrate (also referred to as low-ion energy operating mode).

In one example, the ion source 100 is operated on DC voltage between the second electrode (2) and the third electrode (12), wherein the third electrode (12) has a negative electrical potential (for example up to −5 kV) in relation to the second electrode (2) which is at earth potential. The first electrode (5) can be at earth potential, and the fourth electrode (1) can be preferably electrically floating or connected to earth potential. Owing to the gradient of the electrical field strength between the second electrode (2) and the third electrode (12), ions are accelerated out of the slit (6) (also referred to as emission slit) in the direction of the earthed or electrically floating substrate.

There is therefore no or only a very slight potential difference between the second electrode (2), which influences the plasma potential and therefore the ion start energy, and the substrate. The energy yield of the ions extracted from the emission slit (6) owing to the acceleration as a result of the electrical potential difference between the plasma and the substrate is then, for example, at most in the two-digit eV range. In order to minimize the charging of electrically floating substrates and therefore the shielding of the ion beam, in addition to the ion source an additional electron source can be provided, which neutralizes a surface charge of the substrate or other built-in components in the surrounding environment by means of electrons provided thereby. Since the low ion energy does not cause any or only causes slight parasitic coating on the second electrode as a result of sputtering of the substrate or of the third electrode (12), an additional cleaning phase (i.e. a polarity reversal of the DC voltage) is not absolutely necessary, but can very well be used if required.

Figure 21:
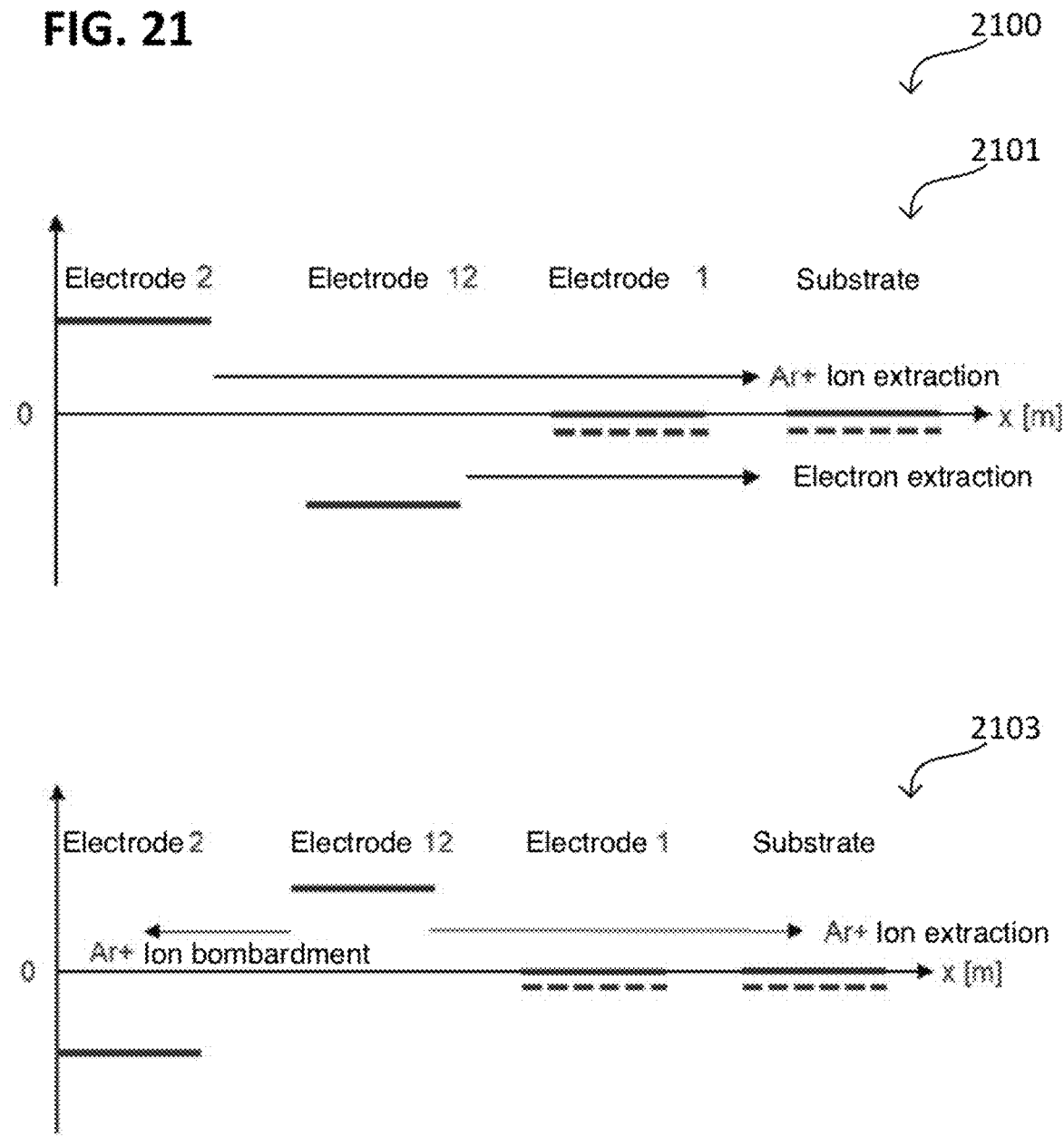

FIG. 21 illustrates an exemplary implementation of the AC operating mode 1900 in accordance with various embodiments 2100, in which the ion source 100 has the shielding configuration, in a plurality of schematic graphs 2101, 2103, which illustrate the electrical voltage 1901 along the path x (for example in metres) which leads from the second electrode 102*b* to the substrate. Graph 2101 again shows the anode phase 152 and graph 2103 shows the cathode phase 154.

The shielding configuration, in addition to improved ion beam focusing, makes it possible for the fourth electrode (1) to be incorporated in the circuit for the plasma generation, for example in the AC voltage operating mode.

In the anode phase 152 (ion source operating mode), therefore in addition a plasma can be generated between the fourth electrode (1) and the third electrode (12) from which electrons can be extracted from the plasma owing to the electrical field gradient between the fourth electrode (1) (in this case the anode) and the third electrode (12) (in this case the cathode).

These electrons can be used for neutralization of surface charges of the substrate and thereby result in an additional electron source not necessarily being required if the substrate is electrically floating and/or non-conductive and surface charges need to be neutralized.

In the cathode phase 152 (cleaning operating mode), ions can likewise be extracted from the plasma since an additional plasma is formed between the fourth electrode (1) and the third electrode (12) from which, owing to the electrical field gradient between the fourth electrode (1) (in this case the cathode) and the third electrode (12) (in this case the anode), ions are accelerated out of the plasma onto the substrate. The extracted ions therefore enable, for example, pre-treatment or physical etching of the substrate surface and therefore a continuous ion source operating mode including the cleaning of the second electrode (2).

In the text which follows, various examples are described which relate to what has been described above and is illustrated in the figures.

Example 1 is an ion source having: a multiplicity of electrodes, which are mounted electrically separated (for example DC-isolated) from one another and have: a first electrode, which has a depression; a second electrode, which is arranged in the depression; a third electrode, which partially covers the depression and through which a slit passes which exposes the second electrode; one or more than one magnet, which is designed to provide a magnetic field in the slit.

Example 2 is the ion source in accordance with example 1, further having: a dielectric first holding structure, which holds the second electrode (for example supported on the first electrode) and electrically separates (for example DC-isolates) it from the first electrode; and/or a dielectric second holding structure, which holds the third electrode (for example supported on the first electrode) and electrically separates (for example DC-isolates) it from the first electrode.

Example 3 is an ion source, having: a first electrode, which has a depression; a second electrode, which is arranged in the depression; a dielectric first holding structure, which holds the second electrode and electrically separates (for example DC-isolates) it from the first electrode; a third electrode, which partially covers the depression and through which a slit passes which at least partially (i.e. partially or completely) exposes the second electrode; a dielectric second holding structure, which holds the third electrode and electrically separates (for example DC-isolates) it from the first electrode; one or more than one magnet, which is designed to provide a magnetic field in the slit.

Example 4 is the ion source in accordance with one of examples 1 to 3, wherein the third electrode has a first plate-shaped segment and a second plate-shaped segment, between which the slit is formed.

Example 5 is the ion source in accordance with one of examples 1 to 4, wherein the third electrode has a ferromagnetic material or is formed therefrom, which preferably adjoins the slit (for example on both sides of the slit).

Example 6 is the ion source in accordance with one of examples 1 to 5, wherein the one or more than one magnet is arranged outside the depression and/or adjoins the third electrode.

Example 7 is the ion source in accordance with one of examples 1 to 6, wherein the one or more than one magnet is arranged within the depression and/or adjoins the first electrode.

Example 8 is the ion source in accordance with one of examples 1 to 7, wherein the first electrode is designed to be trough-shaped; and/or wherein the third electrode is designed to be plate-shaped (for example at least in segments).

Example 9 is the ion source in accordance with one of examples 1 to 8, wherein the slit has one or more than one section which is extended along a plane of the third electrode (for example having two sections next to one another).

Example 10 is the ion source in accordance with one of examples 1 to 9, wherein the slit is extended along a closed path. The ion source can also operate when the path of the slit is not necessarily closed, but is markedly more in homogeneous in terms of the ion flow distribution and more inefficient in terms of the ion flow extraction.

Example 11 is the ion source in accordance with one of examples 1 to 10, wherein the slit is delimited on mutually opposite sides by faces of the third electrode which run at an angle to one another.

Example 12 is the ion source in accordance with one of examples 1 to 11, wherein the slit passes through the third electrode along a direction away from the second electrode.

Example 13 is the ion source in accordance with one of examples 1 to 12, (for example the multiplicity of electrodes) further having: a fourth electrode, through which an additional slit passes (wherein, for example, the third electrode is arranged between the first electrode and the fourth electrode); wherein the slit is arranged between the additional slit and the second electrode (for example the slit and the additional slit continuing one another); an optional dielectric third holding structure, which holds the fourth electrode and electrically separates it from the third electrode.

Example 14 is the ion source in accordance with example 13, wherein the additional slit passes through the fourth electrode along a direction (for example extended through the slit) away from the second electrode.

Example 15 is the ion source in accordance with one of examples 13 or 14, wherein the additional slit is delimited on mutually opposite sides by additional faces of the fourth electrode which run at an angle to one another.

Example 16 is the ion source in accordance with example 13, wherein a spacing between the two additional faces substantially corresponds to a spacing between the two faces of the third electrode which delimit the slit on mutually opposite sides (for example running parallel to one another).

Example 17 is the ion source in accordance with one of examples 13 to 16, wherein the fourth electrode is designed and arranged in such a way that there is a linear path from said fourth electrode to the second electrode which is extended through the slit.

Example 18 is a method for driving an ion source in accordance with one of examples 1 to 17, the method having: application (or provision of instructions therefor) of a first voltage to the second electrode and the third electrode; and application (or provision of instructions therefor) of a second voltage (for example earth) to the first electrode (and, if present, to the fourth electrode); wherein optionally the first voltage has an AC voltage (for example the polarity thereof changes with respect to the second voltage with a regular repetition).

Example 19 is a method for driving an ion source in accordance with the one of examples 1 to 17, the method having: application (or provision of instructions therefor) of a first voltage to the third electrode; and application (or provision of instructions therefor) of a second voltage (for example earth) to the second electrode and the first electrode; wherein optionally the first voltage has a DC voltage (for example the polarity thereof and/or difference with respect to the second voltage remains constant); wherein optionally the fourth electrode, if present, is DC-isolated from the first voltage and from the second voltage.

Example 20 is a method for driving an ion source in accordance with one of examples 1 (for example, see example 13) to 17, the method having: detection (or provision of instructions therefor) of a parameter which represents an ion beam generated by means of the ion source (for example the actual state thereof); optional changing (or provision of instructions therefor) of an electrical variable (for example electrical voltage, electrical power and/or electrical current) supplied to the ion source (for example the first electrode thereof and/or the third electrode thereof and/or the fourth electrode thereof and/or the second electrode thereof) on the basis of the parameter; optional changing (or provision of instructions therefor) of a gas (for example the gas flow thereof, the chemical composition thereof and/or the pressure thereof) supplied to the ion source (for example the slit thereof) on the basis of the parameter, wherein the electrical variable has, for example, a voltage applied to the ion source (for example the first electrode thereof and/or the third electrode thereof and/or the fourth electrode thereof and/or the second electrode thereof) (for example corresponds to the voltage). For example, given a constant discharge voltage, the supplied quantity of gas can be changed as manipulated variable, and the discharge power can be used as reference variable.

Example 21 is a method for treating a substrate, the method having: the method in accordance with one of examples 18 to 20, application (or provision of instructions therefor) of the second voltage to a substrate which is being treated by means of the ion source.

Example 22 is a control apparatus, which is designed to perform the method in accordance with one of examples 18 to 21.

Example 23 is a drive arrangement having: the control apparatus in accordance with example 22, and a voltage source for providing the voltage applied to the substrate and/or to one or more than one electrode of the ion source, wherein the voltage source is designed to change the voltage in accordance with the instructions; the drive arrangement optionally further having: a gas flow regulator for providing the process gas flow, wherein the gas flow regulator is designed to change the electrical characteristic variables (discharge voltage or discharge current and/or discharge power and/or ion beam current) of the plasma discharge or the ion beam.

What is claimed is:

1. An ion source, comprising:
a multiplicity of electrodes, which are mounted electrically separately from one another and comprise:
a first electrode, which has a depression;
a second electrode, which is arranged in the depression;
a third electrode, which partially covers the depression and through which a slit passes which exposes the second electrode; and
one or more magnets, which are designed to provide a magnetic field in the slit.

2. The ion source of claim 1, further comprising:
a dielectric first holding structure, which holds the second electrode and electrically separates it from the first electrode; and
a dielectric second holding structure, which holds the third electrode and electrically separates it from the first electrode.

3. The ion source of claim 1, wherein the third electrode comprises a first plate-shaped segment and a second plate-shaped segment, between which the slit is formed.

4. The ion source of claim 1, wherein the third electrode comprises a ferromagnetic material or is formed therefrom, and adjoins the slit.

5. The ion source of claim 1, wherein the one or more than one magnet is arranged outside the depression and/or adjoins the third electrode.

6. The ion source of claim 1, wherein the one or more than one magnet is arranged within the depression and/or adjoins the first electrode.

7. The ion source of claim 1, wherein the first electrode is designed to be trough-shaped.

8. The ion source of claim 1, wherein the slit has one or more than one section that is extended along a plane of the third electrode.

9. The ion source of claim 1, wherein the slit passes through the third electrode along a direction away from the second electrode.

10. The ion source of claim 1, wherein the slit is extended along a closed path.

11. The ion source according to claim 1, further comprising:
a fourth electrode, through which an additional slit passes;
wherein the slit is arranged between the additional slit and the second electrode.

12. The ion source of claim 11, wherein the additional slit is delimited on mutually opposite sides by additional faces of the fourth electrode which run at an angle to one another.

13. The ion source of claim 12, wherein a spacing between the two additional faces substantially corresponds to a spacing between the two faces of the third electrode which delimit the slit on mutually opposite sides.

14. A method for driving an ion source;
wherein the ion source comprises:
a multiplicity of electrodes, which are mounted electrically separately from one another and comprise:
a first electrode, which has a depression;
a second electrode, which is arranged in the depression;
a third electrode, which partially covers the depression and through which a slit passes which exposes the second electrode; and
one or more magnets, which are designed to provide a magnetic field in the slit; and
wherein the method comprises:
applying a first voltage to the second electrode and the third electrode; and
applying a second voltage to the first electrode which differs from the first voltage.

15. A method for driving an ion source,
wherein the ion source comprises:
a multiplicity of electrodes, which are mounted electrically separately from one another and comprise:
a first electrode, which has a depression;
a second electrode, which is arranged in the depression;
a third electrode, which partially covers the depression and through which a slit passes which exposes the second electrode; and
one or more magnets, which are designed to provide a magnetic field in the slit; and
wherein the method comprises:
applying a first voltage to the third electrode; and
applying a second voltage to the second electrode and the first electrode which differs from the first voltage.

* * * * *